(12) United States Patent
Kitamura et al.

(10) Patent No.: US 6,630,991 B2
(45) Date of Patent: Oct. 7, 2003

(54) THERMAL PROCESSING APPARATUS

(75) Inventors: Masayuki Kitamura, Kanagawa (JP); Eisuke Morisaki, Kanagawa (JP); Yun Mo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 09/838,566

(22) Filed: Apr. 20, 2001

(65) Prior Publication Data

US 2002/0020696 A1 Feb. 21, 2002

(30) Foreign Application Priority Data

Apr. 21, 2000 (JP) .......................... 2000-121634
Apr. 21, 2000 (JP) .......................... 2000-121662

(51) Int. Cl.[7] .............. G01J 5/48; G01J 5/62; F27D 11/12; H05B 1/02
(52) U.S. Cl. ............. 356/43; 219/494; 432/49
(58) Field of Search .............. 219/448.11, 448.12, 219/494; 356/43, 44, 45, 46, 47, 48; 432/49; 438/7, 16, 795, 799; 700/121

(56) References Cited

U.S. PATENT DOCUMENTS 5,874,711 A * 2/1999 Champetier et al. ........ 219/497
6,293,696 B1 * 9/2001 Guardado .................. 374/2

OTHER PUBLICATIONS

Fordham et al., "Emissivity Correcting Pyrometer for Temperature Measurement in Low Pressure Chemical Vapor Deposition", 1993, IEEE,University/Government/Industry Microelectronics Symposium, May 1993., Proceedings of the Tenth Biennial, pp. 223–228.*

* cited by examiner

Primary Examiner—Evan Pert
(74) Attorney, Agent, or Firm—Pillsbury Winthrop LLP

(57) ABSTRACT

A method of detecting a temperature of an object in a multiple-reflection environment by a radiation pyrometer includes the steps of detecting a radiation strength emitted from a target region of an object, applying a correction to the radiation strength so as to correct the effect of multiple reflections of a radiation emitted from the object, applying a correction to the radiation strength so as to correct a reflection loss caused at an end surface of an optical medium interposed between the object and a sensing head of the pyrometer, applying a correction to the radiation strength with regard to an optical absorption loss caused in the optical medium, and applying a correction to the radiation strength with regard to a stray radiation coming in to the sensing head from a source other than the target region of the object.

14 Claims, 14 Drawing Sheets

THERMAL PROCESSING APPARATUS

BACKGROUND OF THE INVENTION

The present invention generally relates to fabrication of semiconductor devices and more particularly to a rapid thermal processing apparatus.

The art of rapid thermal processing (RTP) includes the processes such as rapid thermal annealing (RTA), rapid thermal cleaning (RTC), rapid thermal chemical vapor deposition (RTCVD), rapid thermal oxidation (RTO), rapid thermal nitridation (RTN), and the like, and is used extensively in the fabrication process of semiconductor devices including memory integrated circuits and logic integrated circuits.

A typical fabrication process of a semiconductor integrated circuit includes various thermal process steps such as film deposition, annealing, oxidation, diffusion, sputtering, etching, nitridation, and the like. Thus, a semiconductor substrate is subjected to a number of such thermal process steps.

An RTP process is a promising substrate processing for improving the yield and quality of semiconductor devices, in view of the fact that the temperature rise and fall are carried out in a short time period at a very large rate. By using an RTP process, the duration in which the substrate is subjected to a high temperature is reduced substantially.

A conventional RTP apparatus generally includes a cluster-type processing chamber for a single-wafer processing of a substrate, wherein the substrate may be a semiconductor wafer, a glass substrate carrying a photomask, a glass substrate for a liquid crystal display device, a substrate for an optical disk, and the like. The processing chamber has a quartz window and a high-power lamp such as a halogen lamp is disposed adjacent to the quartz window on and/or below the processing chamber so as to heat the substrate in the processing chamber through the quartz window. The lamp carries a reflector at the side opposite to the side in which the substrate is located.

Typically, the quartz window is formed to have a plate-like form, while a tubular-form window is also possible. In the latter case, the substrate to be processed is accommodated in the tubular quartz window. In the event the processing chamber is evacuated by a vacuum pump, it is preferable to form the quartz window to have a thickness of several ten millimeters (30–40 mm) so as to secure a sufficient mechanical strength for bearing the atmospheric pressure applied to the evacuated processing chamber. In view of the tendency that a thermal stress causes the quartz window to be concaved toward the interior of the processing chamber, there are cases in which the quartz window is provided with a compensating convex curve such that the quartz window projects outward from the processing chamber.

In order to achieve a uniform heating, a number of halogen lamps are arranged adjacent to the quartz window, wherein the thermal radiation produced by the halogen lamps are directed toward the substrate in the processing chamber by the reflector provided behind the halogen lamps. Typically, the processing chamber has a gate valve on the sidewall thereof for in-and-out operation of the substrate, and a gas supply nozzle is provided also on the sidewall of the processing chamber.

In such an RTP apparatus, it is important to measure the substrate temperature accurately for achieving reliable processing. For this purpose, there is provided a temperature detector on the processing chamber such that the temperature detector detects the temperature of the substrate in the processing chamber. While such a temperature detector can be formed by a thermocouple, the use of a thermocouple is not preferable in an RTP apparatus as there is a possibility that the metal constituting the thermocouple may cause a contamination of the substrate.

In view of the situation noted above, conventional RTP apparatuses have used a radiation pyrometer for temperature detection of the substrate, wherein such a radiation thermometer or pyrometer detects the strength of the thermal radiation emitted from the rear surface of the substrate. The thermal radiation strength thus detected is converted to temperature based on the emissivity $\epsilon$ according to the relationship $$E_m(T) = \epsilon E_{BB}(T) \tag{1}$$

wherein $E_m$ (T) represents the detected radiation strength while $E_{BB}$ (T) represents the radiation strength of a black body at the temperature T. The use of such a pyrometer is already disclosed in Japanese Laid-Open Patent Publication 11-258051.

In operation of the RTP apparatus, a wafer to be processed is introduced into the processing chamber and is held on a wafer stage by a chuck mechanism. Further, a processing gas such as a nitrogen gas or oxygen gas is introduced into the processing chamber from the gas supply nozzle, and the halogen lamp is energized for rapid heating of the wafer. Thereby, the temperature of the substrate is detected by the radiation pyrometer and a controller controlling the energization of the halogen lamp achieves a feedback control in response to the output of the radiation pyrometer.

On the other hand, such a conventional RTP apparatus using a radiation pyrometer has a drawback in that, because of the small distance between the substrate and the sensing head of the pyrometer, there occurs a temperature rise in the sensing head of the pyrometer as a result of thermal radiation from the wafer and an error is introduced into the result of the temperature detection.

While such an error can be avoided by providing a cooling fixture to the pyrometer, such a construction increases the size and cost of the RTP apparatus.

Further, the conventional RTP apparatus using a radiation pyrometer for the temperature detection of the substrate has suffered from the problem of low accuracy of temperature measurement, wherein it was discovered that the problem has been caused not only by the foregoing temperature rise of the pyrometer but also by other reasons.

As a result of investigation constituting the foundation of the present invention, the inventor of the present invention has discovered that there occurs a deviation in the Eq. (1) noted before, provided that: (1) the sensing head of the pyrometer detects multiple reflection of the thermal radiation emitted by the substrate; (2) there is a thermal radiation coming in from a heat source other than the target region of the wafer; (3) there is a reflection loss at the end surface of the optical medium interposed between the wafer and the sensing head; and (4) there is a substantial absorption loss in the optical medium. In the case of the RTP apparatus, in which a reflective coating is provided on various parts of the processing chamber for improving the thermal efficiency, the effect of the foregoing factors (1) and (2) cannot be ignored.

SUMMARY OF THE INVENTION

Accordingly, it is a general object of the present invention to provide a novel and useful thermal processing apparatus wherein the foregoing problems are eliminated.

Another and more specific object of the present invention is to provide a thermal processing apparatus wherein accuracy of temperature detection is improved.

Another object of the present invention is to provide an improved temperature detection method for a thermal processing apparatus wherein the factors causing a detection error are taken into consideration and the detection error is eliminated.

Another object of the present invention is to provide a method of detecting a temperature of an object disposed in a multiple-reflection environment by way of a radiation pyrometer, comprising the steps of:

detecting a radiation strength emitted from a target region of said object;

applying a correction to said radiation strength so as to compensate for the effect of multiple reflections of a radiation emitted from said object;

applying a correction to said radiation strength so as to compensate for a reflection loss caused at an end surface of an optical medium interposed between said object and said sensing head;

applying a correction to said radiation strength so as to compensate for an optical absorption loss caused in said optical medium; and applying a correction to said radiation strength so as to compensate for a stray radiation coming in to said sensing head from a source other than said target region of said object.

According to the present invention, the deviation of the temperature detected by the pyrometer from the true temperature is effectively compensated for with regard to: the multiple reflections taking place in the multiple reflection environment; the reflection loss at the surface of the optical medium between the substrate and the sensing head; the absorption loss in the optical medium; and the stray thermal radiation coming in to the sensing head from a source other than the target region of the object. The object may be a substrate or a wafer and the multiple-reflection environment may be a processing chamber of a thermal processing apparatus. Thus, an accurate temperature measurement becomes possible in a thermal processing apparatus by using a pyrometer, and the temperature control in such a thermal processing apparatus is improved.

Another object of the present invention is to provide a thermal processing apparatus, comprising:

a processing chamber including therein a stage adapted for supporting a substrate thereon, said processing chamber having an evacuation port for connection to an evacuation system;

a heat source provided so as to heat said substrate in said processing chamber;

a radiation pyrometer coupled to said processing chamber for measurement of a temperature of said substrate;

a control unit for controlling energization of said heat source in response to a temperature of said substrate; and a cooling mechanism for cooling a part of said processing chamber in the vicinity of said radiation pyrometer, said radiation pyrometer comprising:

a rotary chopper having a slit and a high-reflective surface and a low-reflective region, said rotary chopper being disposed in an optical path of a radiation emitted from said substrate;

a transparent rod disposed in said optical path between said substrate and said chopper, said transparent rod allowing a multiple reflection of said radiation between said wafer and said chopper; and a detector disposed behind said chopper for detecting said radiation passed through said slit.

According to the present invention, the distance between the detector and the substrate is increased, and the effect of temperature rise of the detector and associated deviation of the temperature detection are successfully avoided.

Other objects and further features of the present invention will become apparent from the following detailed description when read in conjunction with the attached drawings.

DETAILED DESCRIPTION OF THE PREFERRED EMBODIMENTS

Figure 1:
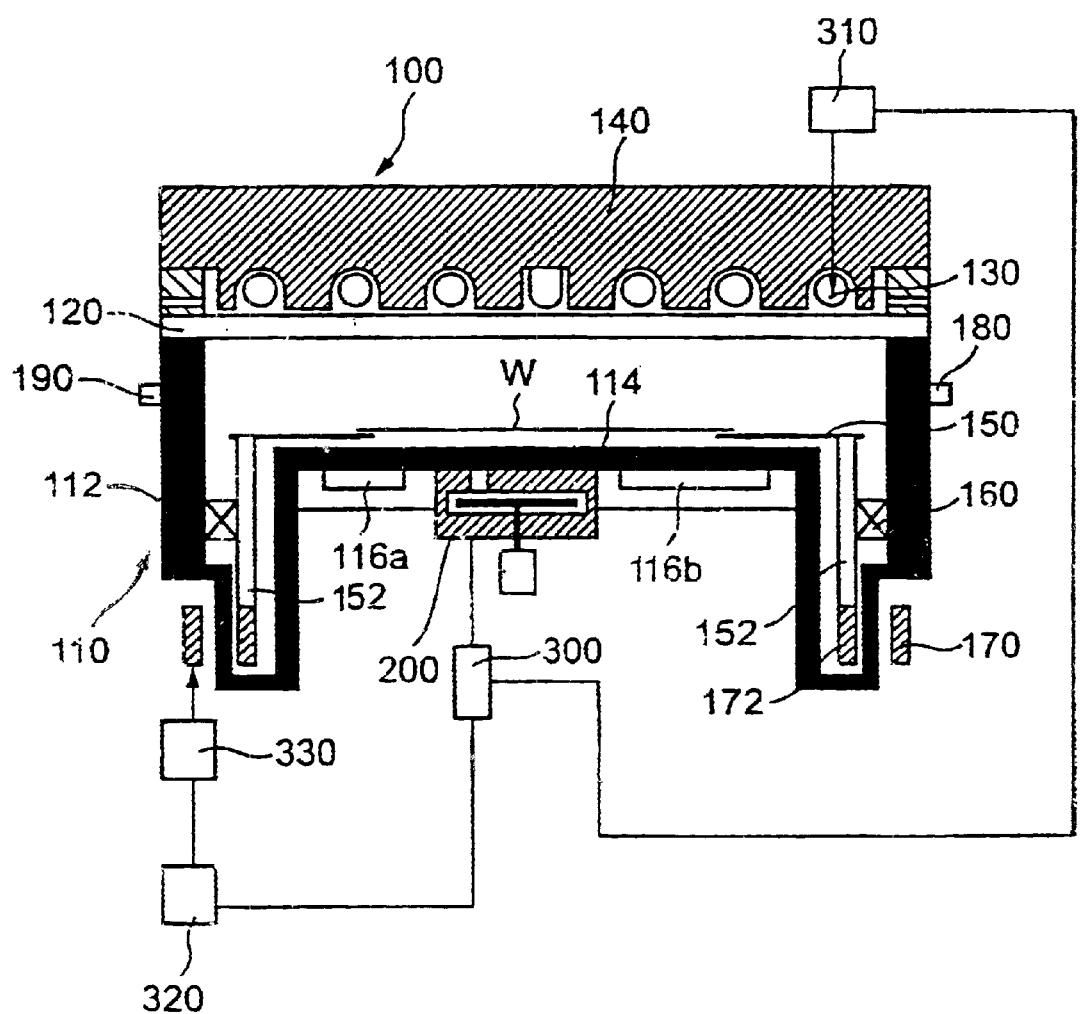
FIG. 1 is a diagram showing the construction of an RTP apparatus according to an embodiment of the present invention.

Hereinafter, the construction of a rapid thermal processing (RTP) apparatus 100 will be described with reference to FIG. 1 showing a general construction of the apparatus 100 in a cross-sectional view.

Referring to FIG. 1, the RTP apparatus 100 generally includes a processing chamber 110, a quartz window 120, a heating lamp 130, a reflector 140, a support ring 150, a bearing 160, a permanent magnet 170, a gas inlet port 180, a gas exhaust port 190, a radiation pyrometer 200 and a system controller 300.

The processing chamber 110 is formed of cylindrical chamber body of stainless steel or aluminum, and the quartz window 120 is provided on the processing chamber 110 so as to cover the top opening of the chamber body. By providing the quartz window 120, a space for processing a wafer W is defined inside the processing chamber 110 such that the space is isolated from the atmospheric environment.

In order to support the wafer W, there is provided a rotatable cylindrical support member 152 in the processing chamber 110, wherein the support member 152 carries thereon the support ring 150 on a top part thereof. As noted previously, the wafer W is supported on the support ring 150.

The processing chamber 110 has a cylindrical sidewall part 112, wherein the cylindrical sidewall part 112 carries thereon a gas inlet 180 connected to a gas source not illustrated and an exhaust port 190 connected to a vacuum pump not illustrated. By evacuating through the exhaust port 190, the interior of the processing chamber 110 is maintained at a reduced pressure environment during the wafer processing process. While not illustrated, the RTP apparatus 100 further includes a gate valve for the in-and-out operation of the wafer W.

At a bottom part 114 of the processing chamber 110, there is provided a temperature regulation fixture formed of coolant passages 116a and 116b, wherein the coolant passages 116a and 116b are supplied with a cooling medium. Thus, the bottom part 114 of the processing chamber 110 functions as a cooling plate of the substrate W. The cooling plate 114 can be used as a temperature regulator of the substrate. In this case, the temperature regulator includes a temperature sensor and a heater controlled by the system controller 300 and supplies a cooling water as the cooling medium. Alternatively, other cooling media such as alcohol, galden, flon, and the like, may be used. Any known temperature sensor such as PTC thermister, infrared sensor, thermocouple, and the like, can be used for constructing the temperature regulator. The heater may be formed by winding a heating wire around the tubes constituting the coolant passages 116a and 116b. By controlling the driving current through the heating wire, it is possible to control the temperature of the cooling medium in the coolant passages 116a and 116b.

Figure 2:
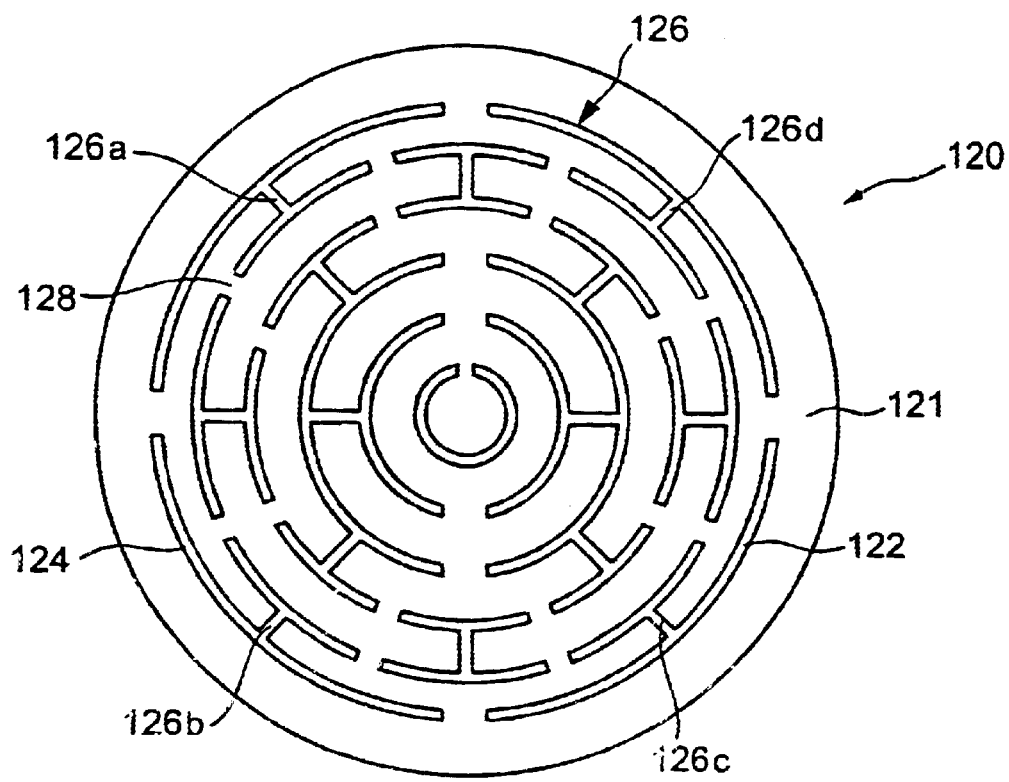
FIG. 2 is a diagram showing the construction of a quartz window used in the RTP apparatus of FIG. 1 in a plan view.
Figure 3:
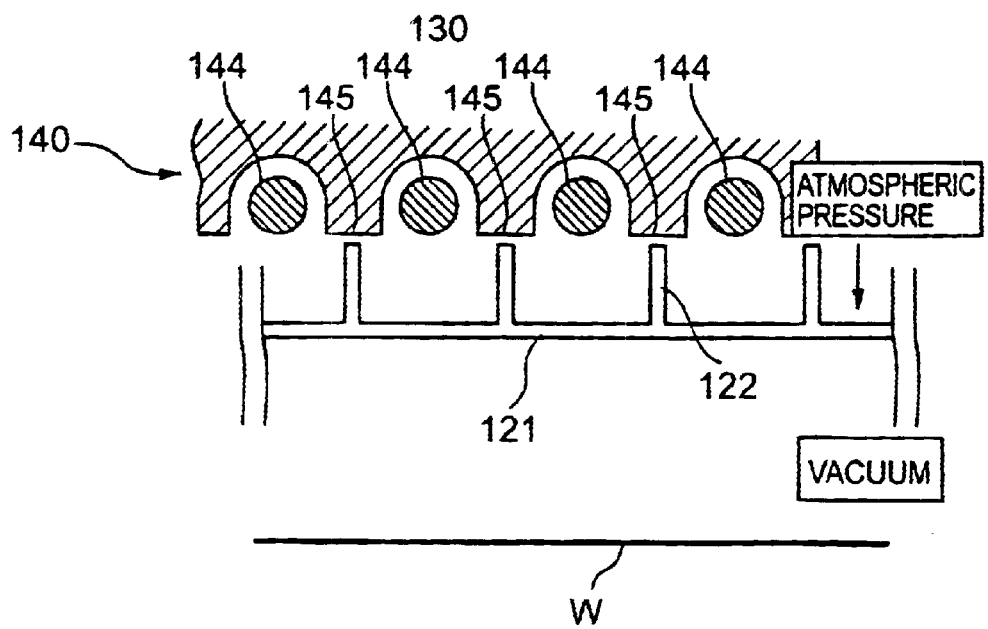
FIG. 3 is a diagram showing a part of the quartz window together with a lamp and a reflector in an enlarged view.

The quartz window 120 is provided on the processing chamber 110 via an airtight seal not illustrated so as to sustain the atmospheric pressure, and the thermal radiation produced by the high-power halogen lamp 130 is directed to the wafer W held in the processing chamber under a reduced pressure environment. As represented in FIG. 2 or FIG. 3, the quartz window 120 may include a disc-shaped quartz plate 121 having a diameter of about 400 mm and a thickness of 2–6 mm, wherein the quartz window 120 further includes a rib structure 122 provided on the quartz plate 121 for reinforcing the mechanical strength thereof. FIG. 2 shows the quartz window 120 in a plan view while FIG. 3 shows the quartz window 120 in an elevational cross-sectional view showing a part of the quartz window 120 including the lamp 130 and the reflector 140 in an enlarged scale.

Referring to FIGS. 2 and 3, the rib structure 122 includes circumferential ribs 124 for reinforcing the mechanical strength of the window 120 in the circumferential direction and radial ribs 126 for reinforcing the mechanical strength in the radial direction, wherein the circumferential ribs 124 are formed with a number of cutouts for providing a passage of the cooling air for cooling a sealed part 136 (FIG. 8) of the lamp 130 where the lamp 130 is sealed against the quartz window 120. Preferably, the ribs 124 and 126 have a thickness of less than 10 mm, more preferably in the range between 2–6 mm and a height of less than about 10 mm. While the illustrated example shows a construction in which the ribs 122 extend in the direction of the lamp 144, the present invention is not limited to such a specific construction, and other constructions such as the one in which the ribs 122 extend toward the wafer W or the one in which the ribs 122 are formed on both top and bottom surfaces of the plate 121, are possible. In the latter cease, the ribs 124 and the ribs 126 may have different sizes.

By providing the ribs 122, the quartz plate 121 is improved with regard to resistance against thermal deformation. Thus, there is no need anymore to form a convex surface and the quartz plate 121 can be formed by a flat disc. Such a flat disc is easily formed as compared with the quartz plate having a curved surface. The ribs 122 may be fixed upon the quartz plate 121 by welding or any other means. For example, the ribs 122 may be formed as an integral body with the quartz plate 121.

Preferably, the quartz plate 121 and the rib 122 constituting the quartz window 120 have a thickness of 10 mm or less, more preferably in the range of 2–6 mm as noted before, wherein the foregoing thickness is substantially smaller than the thickness of several ten millimeters (30–40 mm) used for conventional quartz window. As a result of the use of such a thin quartz window 120, the RTP apparatus 100 of the present embodiment can reduce the optical absorption of the thermal radiation produced by the lamp 130. Thereby, the efficiency of heating the wafer W by the lamp 130 is improved and the desired rapid temperature rise can be achieved at a reduced power consumption. Further, the RTP apparatus 100 of the present embodiment has another advantageous feature of reduced temperature difference between the top surface and the bottom surface of the quartz plate 121. Associated with the reduced temperature difference, the thermal stress caused in the quartz plate 121 is reduced and the problem of thermal damage applied to the quartz plate 121 and causing a damage therein is reduced. The same applies also to ribs 122. Further, because of the reduced temperature rise of the quartz window 120 as compared with conventional quartz windows, it is possible to suppress the deposition of various films or reaction byproducts on the quartz window particularly in the case of a deposition process, and the reproducibility of temperature is guaranteed. Further, the frequency of conducting the cleaning process of the processing chamber 110 can be reduced.

Figure 4:
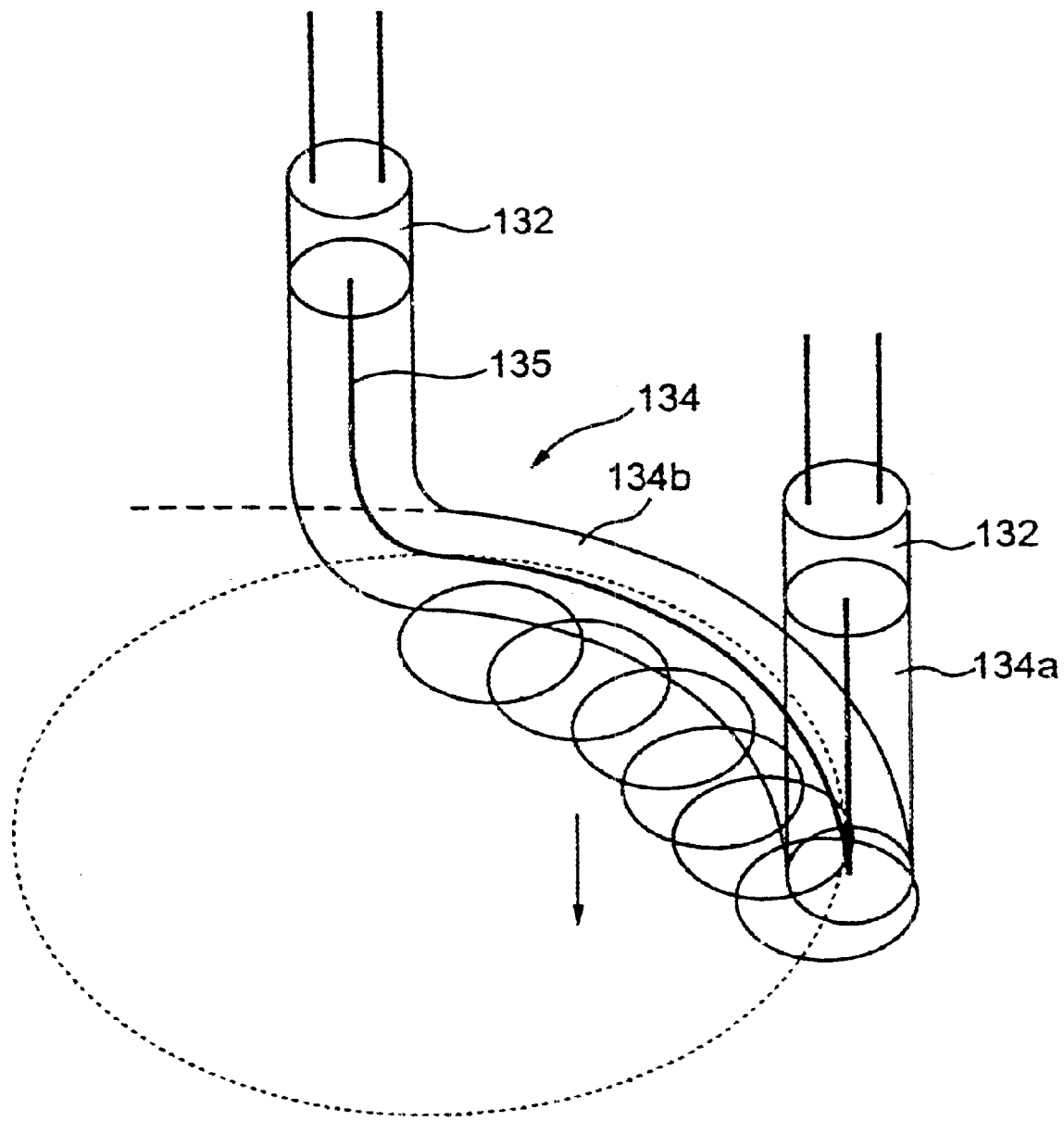
FIG. 4 is a diagram showing the construction of a lamp applicable to the RTP apparatus of FIG. 1.

With regard to the lamp 130, the illustrated example uses a double-ended type lamp, while use of a single-ended type lamp is also possible as will be explained later. Further, the use of a heating wire is also possible. As represented in FIG. 4, a double-ended lamp 130 is a lamp having two interconnection electrodes 132, while a single ended lamp is a lamp having only one interconnection electrode as in the case of a light bulb. The lamp 130 functions as a heat source heating the substrate W and a halogen lamp may be used conveniently for this purpose. Of course, the lamp 130 of the present invention is not limited to a halogen lamp. It should be noted that the output power of the lamp 130 is determined by a lamp driver 310, while the lamp driver 310 is controlled by the system controller 300 as will be explained later and supplies an electric power specified by the system controller 300 to the lamp 130.

Referring to the oblique view of FIG. 4, it can be seen that the lamp 130 includes two interconnection electrodes 132 and a tubular lamp house 134 therebetween, wherein the lamp house 134 accommodates therein a filament 135 extending between the interconnection electrodes 132. As noted previously, the electric power to be supplied to the lamp 130 is provided to the interconnection electrodes 132 under control of the system controller 300. It should be noted that a seal member 136 is provided between the interconnection electrode 132 and the reflector 140A.

As represented in FIG. 4, the lamp house 134 includes a vertical tube 134a and an arcuate horizontal tube 134b bent with regard to the vertical tube 134a, wherein the horizontal tube 134b is disposed between a pair of adjacent ribs 126, such as the arcuate ribs 126a and 126b, forming together generally concentric grooves on the quartz plate 121. Thereby, it should be noted that it is not always necessary to fill all of the grooves formed between adjacent ribs 126 by the lamp 130 but the lamp 130 may be provided to form an arcuate optical source having a predetermined angle. For example, the lamp 130 may be omitted from the groove between the ribs 126b and 126c and from the groove between the ribs 126d and 126a. In this case, the lamp 130 is provided only in the grooves formed between the ribs 126a and is 126b and between the ribs 126c and 126d.

In the present embodiment, the lamps 130 are disposed collectively in a generally concentric form in correspondence to the wafer W having a generally circular form. In such a construction, a number of arcuate lamps having a substantially identical radius of curvature are arranged in a circumferential direction and a number of arcuate lamps having different radius of curvature are arranged in the radial direction.

It should be noted that the present invention does not exclude the use of a straight double-ended type lamp. When using such a straight lamp, it will be necessary to modify the ribs 122 so as to accommodate such straight lamps.

However, the use of the arcuate or curved lamp 130 as set forth above is more advantageous as compared with the case of using straight lamps in view of the fact that a straight lamp covers a wide area of the wafer W and further in view of the fact that the straight lamp is disposed so as to cover the areas of the wafer W having different radial diameters and it is difficult to control the temperature of the circular wafer as compared with the case of using a number of arcuate lamps. By using arcuate lamps, it becomes possible to control the temperature easily for each of the concentric regions of the circular wafer. Further, the directivity of the thermal radiation is improved and the efficiency of heating of the wafer is improved also.

It should be noted that a reflector 140 reflects the radiation of the lamp 130. The reflector 140 has a generally cylindrical form with a cross-section of generally rectangular shape as represented in FIG. 1. In more detail, the reflector 140 includes a plurality of penetrating holes 142 extending perpendicularly to the plane of the quartz window 120 for accommodating the end part 132 of the lamp 134 and a number of concentric grooves 144 for accommodating the lamp house 134b. Further, there is provided, although not illustrated in FIG. 1, a cooling tube inside or outside of the reflector 140.

Further, the reflector has a horizontal part 145 facing the tip end of the ribs 122 between a pair of the grooves 144.

Figure 6:
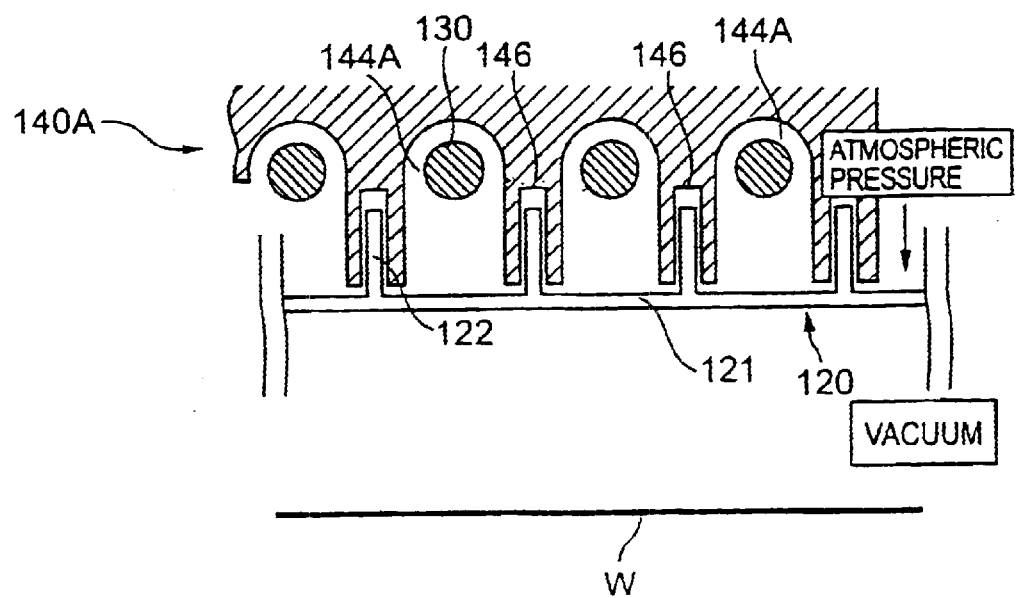
FIG. 6 is a diagram showing a modification of the reflector of FIG. 3 in an enlarged scale.

It should be noted that the reflector 140 may be replaced by the reflector 140A represented in FIG. 6, wherein the reflector 140A includes a number of slits 146 in the foregoing horizontal part 145 for accommodating the ribs 122. It should be noted that FIG. 6 is an enlarged view showing a part of the reflector 140A.

Figure 5:
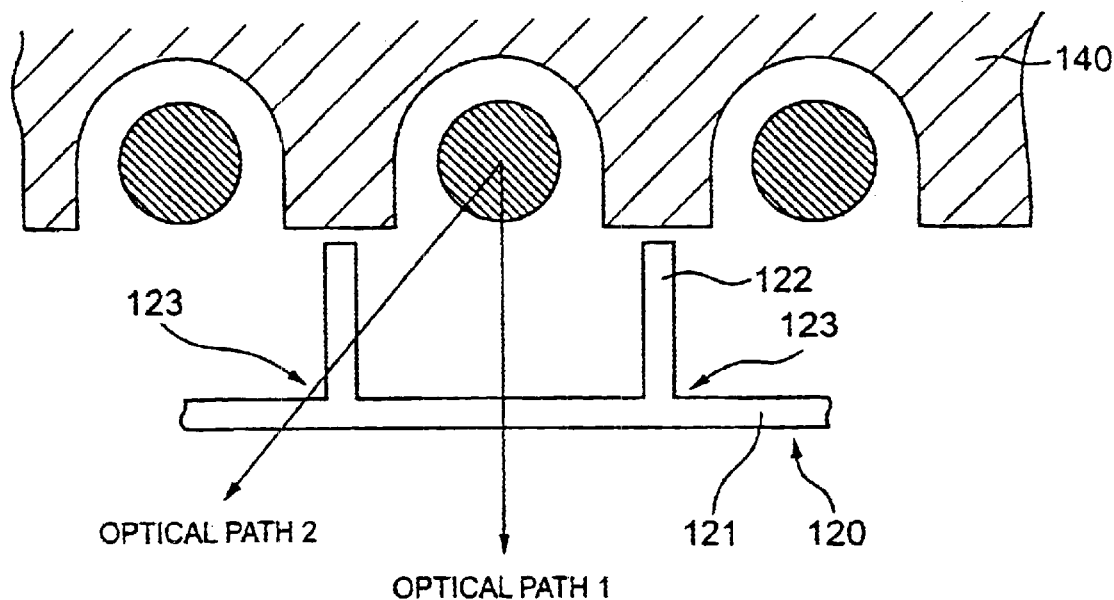
FIG. 5 is a diagram explaining the effect of the radiation incident to the quartz window obliquely.

In the reflector 140 represented in FIG. 3, it should be noted that the optical path 2 for the thermal radiation emitted from the lamp 130 in an oblique direction to the quartz window plate 121 is larger than the optical path 1 emitted perpendicularly to the plate 121. Associated therewith, the absorption of the optical becomes larger for the ray traveling along the optical path 2 than the ray traveling along the optical path 1. Here, it should be noted that FIG. 5 is a cross-sectional view for explaining the effect of the thermal radiation incident to the processing chamber 110 through the quartz window 120.

As a result of such a difference in the infrared absorption, there is induced a temperature difference in the quartz window 120 between the quartz plate 121 and the ribs 122, while such a temperature difference induces a thermal stress in the quartz window 120, which may result in a cracking particularly between the rib 122 and the quartz plate 121. While it is possible to eliminate such a cracking by optimizing the thickness of the ribs 122, it is advantageous to use the reflector 140A of which construction is represented in FIG. 6.

Figure 7:
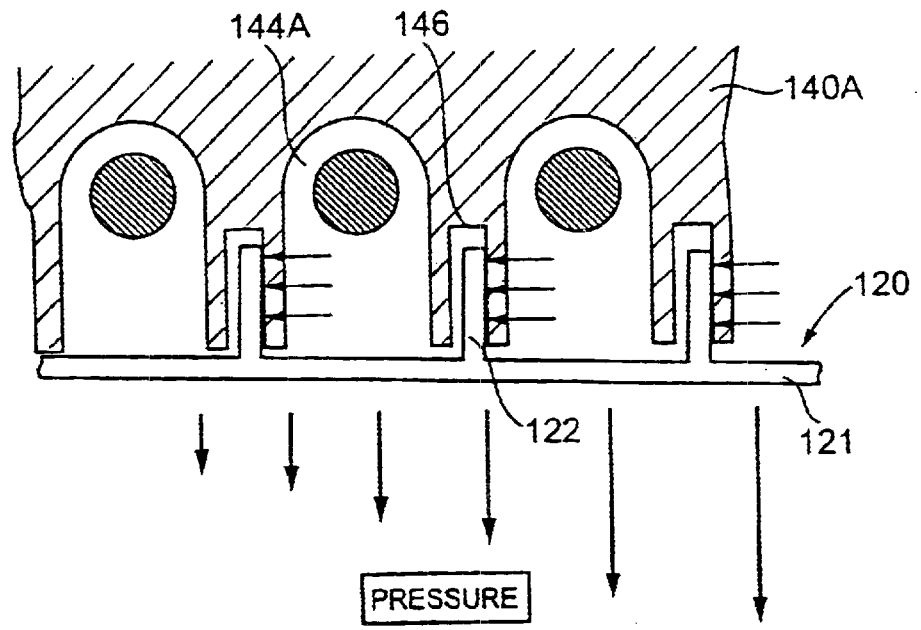
FIG. 7 is a diagram explaining the effect of the construction of FIG. 6.

Referring to FIG. 6, the reflector 140A is different from the reflector 140 in the point that there is provided a grove 144A having a larger depth as compared with the groove 144 and that the slit 122 explained before is provided in the horizontal part 145. By using the reflector 140A, the ribs 122 are inserted into the slits 146 formed in the reflector 140A and the problem of the ribs 122 being irradiated directly by the thermal radiation of the lamp 130 is successfully avoided. Further, the structure of FIG. 6 is advantageous in the point that the air pressure, applied to the quartz window 120 as a result of the pressure difference between the interior of the processing chamber 110 and the atmospheric environment and causing a concaved deformation in the quartz plate 121, is effectively supported by the engagement of the rib 122 and the slit 146 as represented in FIG. 7. It should be noted that FIG. 7 is an enlarged view of a related part of the reflector 140A and the quartz window 120. As a result of such an engagement of the reflector 140A with the ribs 122, a reinforcement of the quartz window 120 is also achieved.

Next, the relationship between the air passage 128 formed in the quartz window 120 and the sealing part 136 of the lamp 130 will be explained with reference to FIGS. 8 and 9.

Figure 8:
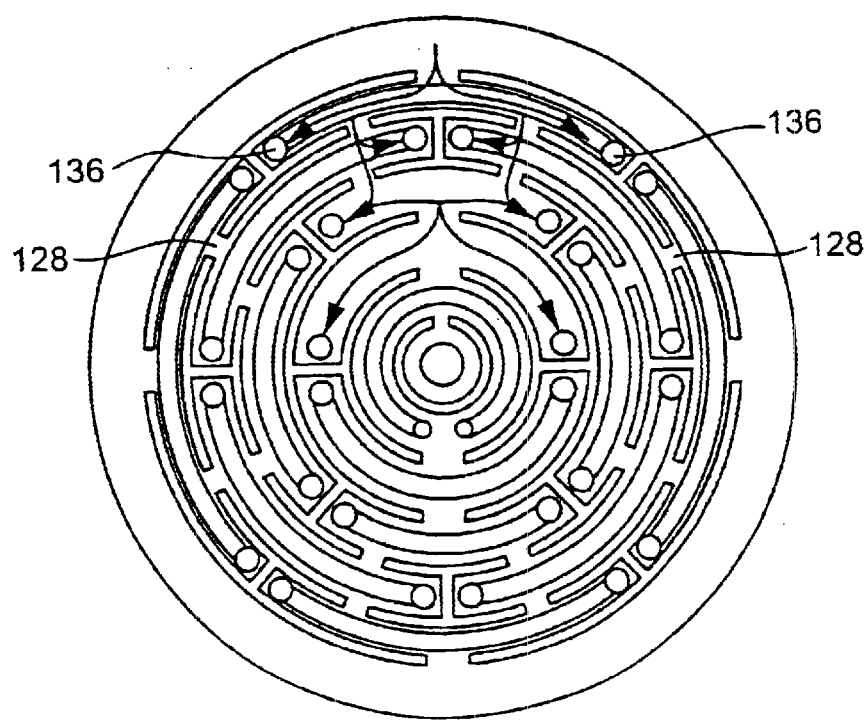
FIG. 8 is a diagram showing the cooling air flow in the quartz window coupled with the reflector of FIG. 6 in a plan view.

Referring to FIG. 8 showing the quartz window 120 in a plan view, it can be seen that a cooling air is caused to flow along the air passage 128. In FIG. 8, the sealing part 136 of the lamp 130 is designated by a circle.

Figure 9:
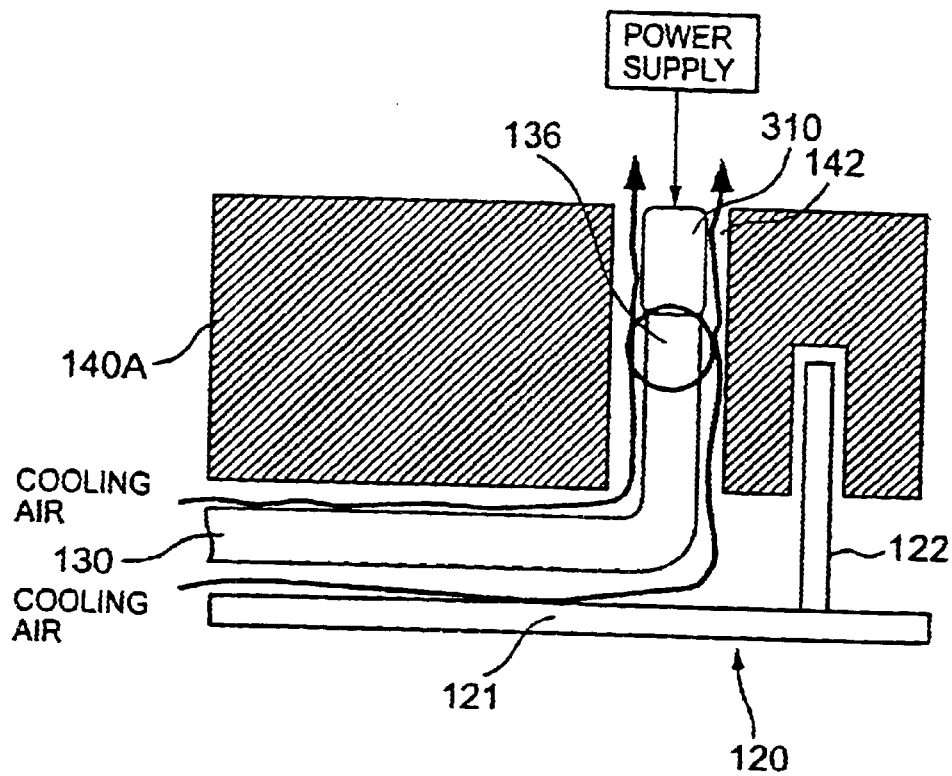
FIG. 9 is a diagram showing the relationship between the cooling air passage in the quartz window and the sealing part of the lamp.

FIG. 9 shows the part including the sealing part 136 of the lamp 130, wherein it should be noted that the lamp 130 is supplied with a driving electric power at the sealing part 136 provided at the end of the tube constituting the lamp 130. As represented in FIG. 9, the sealing part 136 is inserted into the penetrating hole 142 in the reflector 140A, wherein the cooling air penetrates also into the hole 142 and cooling of the sealing part 136 is achieved efficiently. In FIG. 1, the illustration of the construction for introducing the cooling air is eliminated.

Figure 10:
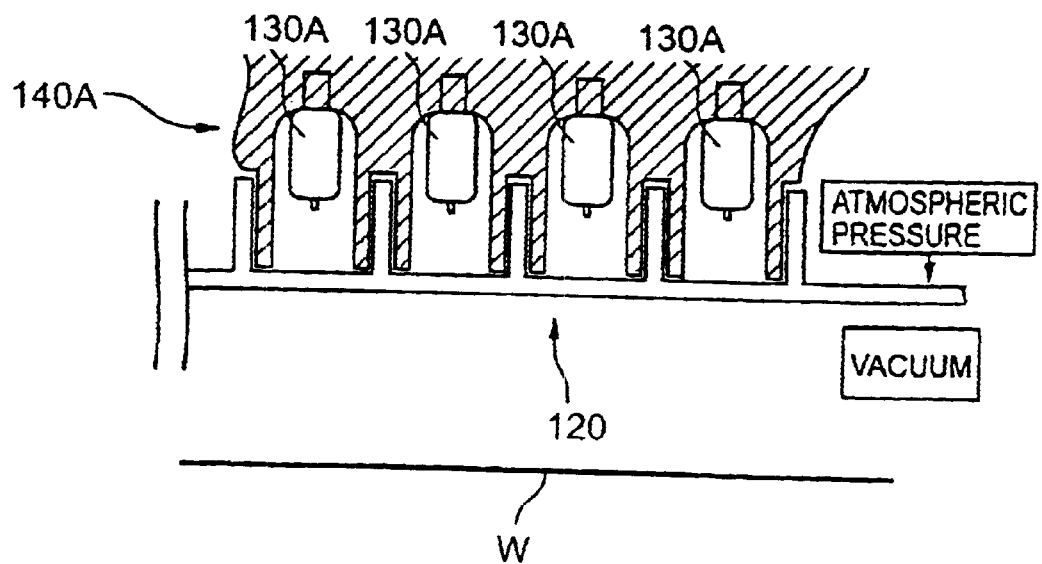
FIG. 10 is a diagram showing a part of the quartz window for the case the double-ended tubular lamp is replaced with a single-ended bulb.
Figure 11:
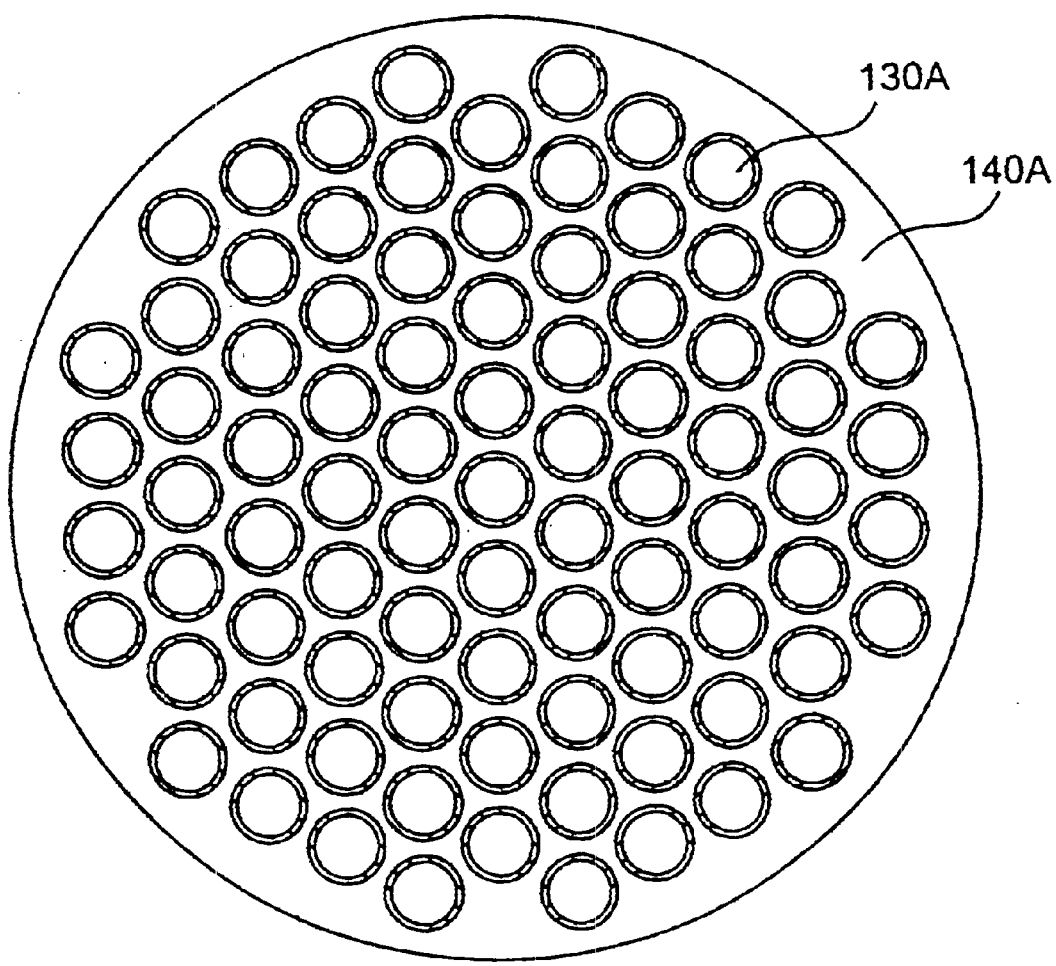
FIG. 11 is a diagram showing the quartz window together with single-ended light bulbs in a plan view.

FIGS. 10 and 11 show the case in which the double-ended type lamp 130 explained heretofore is replaced with a single-ended type lamp 130A, wherein it can be seen that a number of the single-ended type lamps 130A are provided in combination with the reflector 140A. FIG. 10 shows an enlarged part of the quartz window 120 having such single-ended lamps 130A, while FIG. 11 shows the reflector 140A in a plan view. It should be noted that the construction of FIGS. 10 and 11 provides excellent directivity and controllability for the thermal radiation emitted by the lamps 130A.

Figure 12:
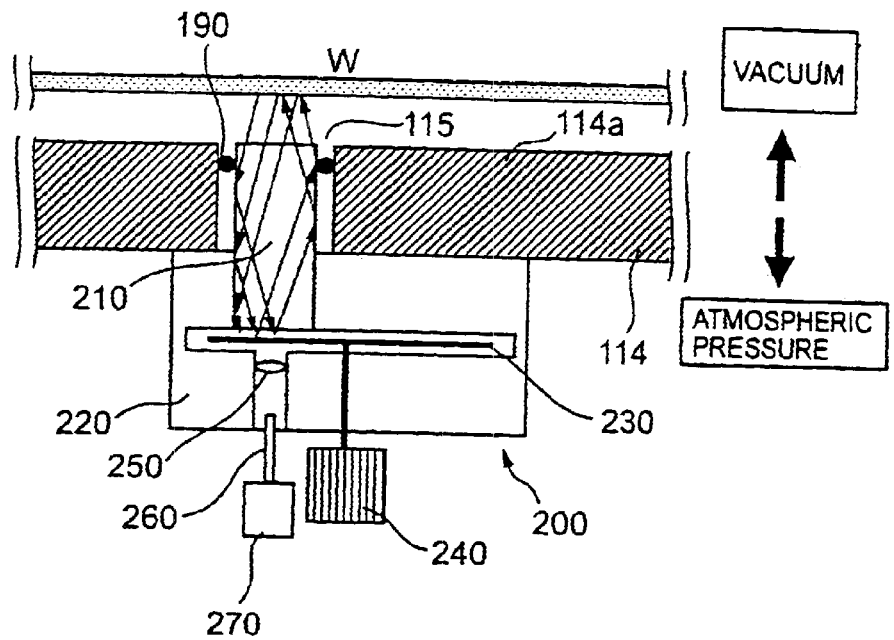
FIG. 12 is a diagram showing the construction of a radiation pyrometer used in the RTP apparatus of FIG. 1 in an enlarged cross-sectional view.
Figure 13:
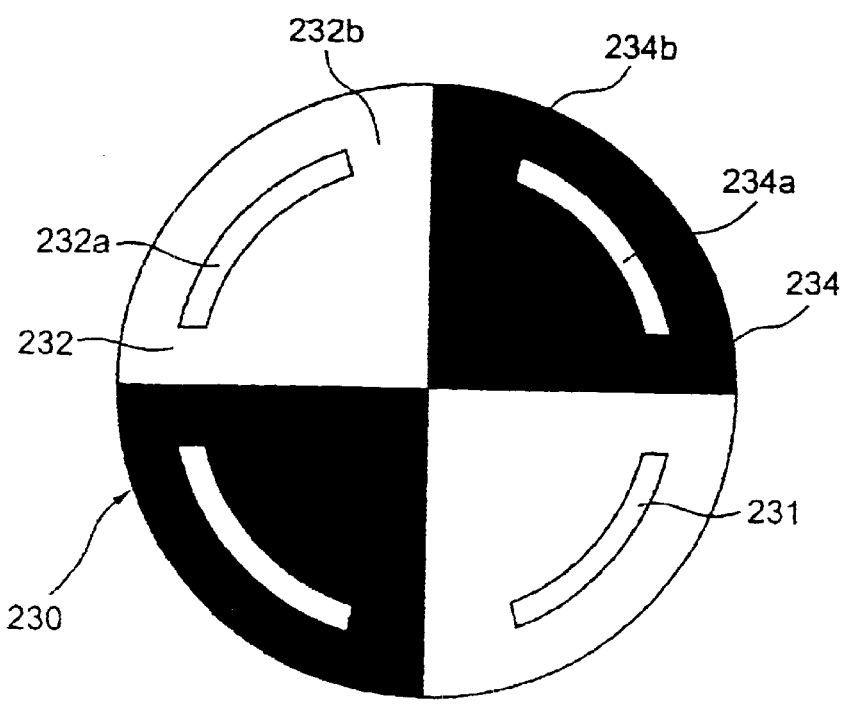
FIG. 13 is a diagram showing the construction of a chopper used in the radiation pyrometer of FIG. 12 in a plan view.

Next, the construction of the radiation pyrometer 200 used in the RTP apparatus 100 of FIG. 1 will be described with reference to FIGS. 12 and 13, wherein FIG. 12 shows a part of the processing chamber 110 including the radiation pyrometer 200 in an enlarged view, while FIG. 13 shows the construction of a chopper 230 used in the radiation pyrometer 200 in a plan view. It should be noted that the radiation pyrometer 200 is provided at a side opposite to the lamp 130 with respect to the wafer W so as to avoid incidence of the radiation of the lamp 130 directly to the radiation pyrometer 200, wherein the present invention does not exclude the case in which the radiation pyrometer 200 is provided at the same side of the lamp 130.

It should be noted that the radiation pyrometer 200 is mounted on a bottom part 114 of the processing chamber 110, wherein the bottom part 114 has an inner surface 114a plated with high reflection film such as a gold film and the inner surface 114a functions as a reflector. When a black surface is used for the surface 114a, it becomes necessary to increase the driving power of the lamp 130 so as to compensate for the absorption loss caused by the bottom part 114 of the processing chamber 110, while such a construction contradicts the requirements of economical operation of the RTP apparatus 100.

The bottom part 114 of the processing chamber 110 is provided with a circular penetrating hole 115 and the radiation pyrometer 200 detects the temperature of the wafer W by detecting the infrared radiation emitted from a predetermined area of the wafer W at the bottom surface. The radiation pyrometer 200 includes a transparent rod 210 of quartz or sapphire inserted into the foregoing penetrating hole 115 and a casing 220 covering the bottom end of the transparent rod 210, wherein the casing 220 accommodates therein a chopper 230 for intermittently interrupting the infrared radiation emitted from the bottom end of the transparent rod 210. The chopper 230 is rotated by a motor 240 provided at the outside of the casing 220 and the infrared radiation passed through the chopper 230 is detected by a detector 270 provided outside the casing 220.

By forming the transparent rod 210 by quartz or sapphire, the rod 210 shows an excellent durability to temperature and maintains an excellent optical property during the use of the RTP apparatus 100, although the material constituting the rod 210 is not limited to quartz or sapphire. Because of the excellent thermal durability of the rod 210, it is not necessary to provide a cooling mechanism to the rod 210, and the RTP apparatus 100 can be formed with a compact size.

If necessary, the rod 210 may be provided so as to project from the inner surface 114a toward the interior of the processing chamber 110. The rod 210 is sealed in the penetrating hole 115 by a seal ring 190, and the processing chamber 110 is effectively maintained at a low pressure.

By providing the rod 210 in the penetrating hole 115, it becomes possible to guide the infrared radiation incident thereto into the casing 220 without causing substantial loss, and the photodetector 270 cooperating with the rod 210 receives the infrared radiation efficiently. Further, the use of the rod 210 enables a multiple reflection of the infrared radiation between the surface of the chopper 230 and the bottom surface of the wafer W as represented in FIG. 12 by arrows. Further, by providing the rod 210 such that the tip end of the rod is located with a short distance from the rear surface of the wafer W, it becomes possible to measure the temperature of the wafer W with high precision.

By using the rod 210, on the other hand, it becomes possible to increase the distance between the wafer W and the casing 220. Thereby, the heating of the casing 220 is held minimum and no cooling mechanism is necessary. Thus, the use of the rod 210 contributes to the downsizing of the RTP apparatus 100. Further, even in the case a cooling mechanism is provided to the casing 220, the use of the rod 210 contributes to the reduction of power consumption of the cooling mechanism.

Figure 24:
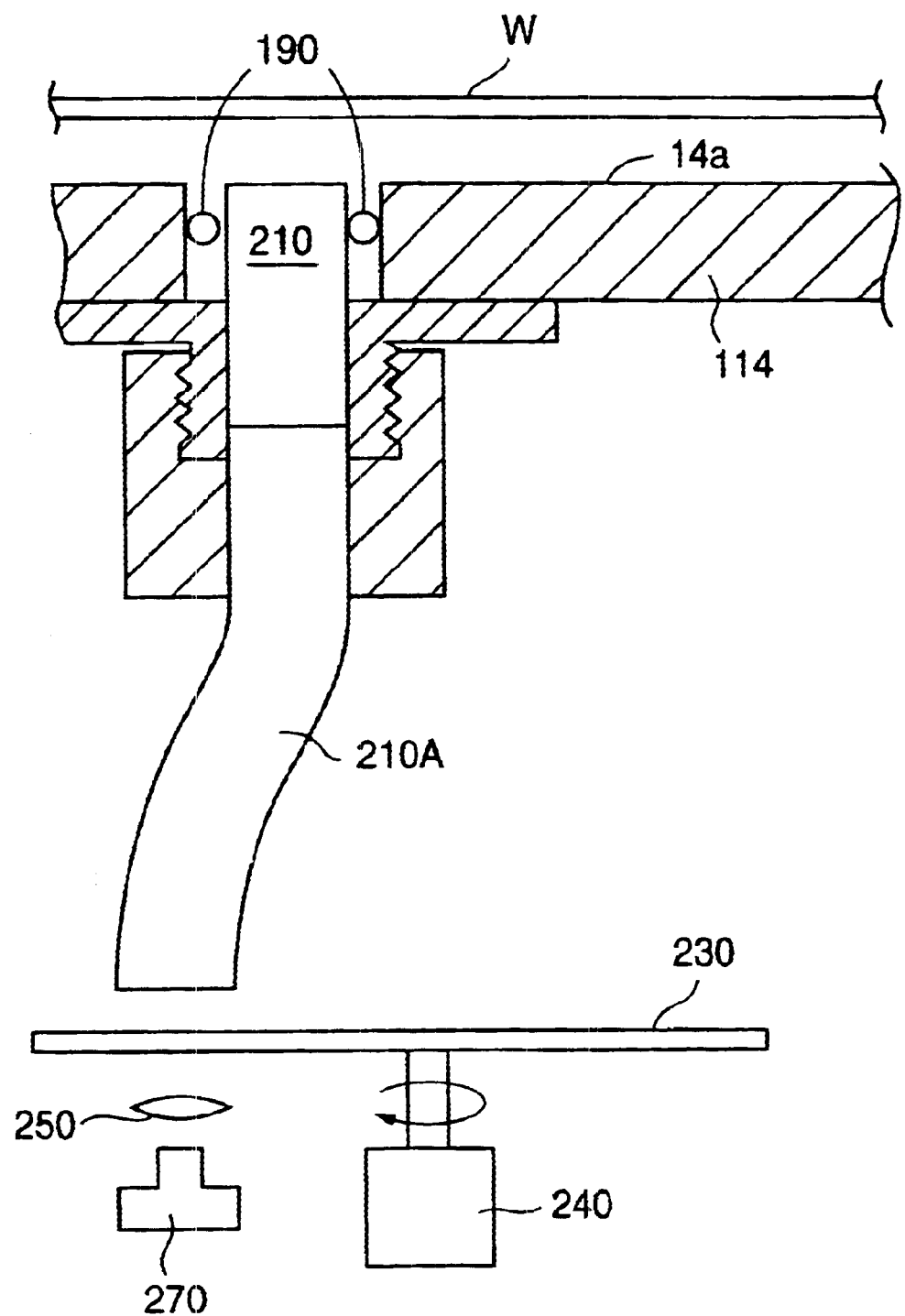
FIG. 24 is a diagram showing a modification of the emission pyrometer of FIG. 12.

It should be noted that the rod 210 may be used together with an optical fiber 210A as represented in FIG. 24. By providing such an optical fiber 210A, the optical path of the infrared radiation to be measured becomes flexible and the degree of freedom of designing the radiation pyrometer 200 is increased. Further, it becomes possible to increase the distance between the main body or casing 220 of the radiation pyrometer 200 from the wafer W and the adversary effects caused in the radiation pyrometer 200 by a thermal deformation is eliminated. Thereby, the accuracy of the temperature measurement is improved.

It should be noted that the casing 220 may have a cylindrical form under the penetrating hole 115.

As represented in FIG. 13, the chopper 230 has a disc shaped member disposed generally horizontally with an offset from the center of the penetrating hole 115 and hence the center of the rod 210. The chopper 230 is connected to a rotary shaft of the motor 240 and is rotated in response to energization of the motor 240.

As represented in FIG. 13, the chopper 230 includes quadrant sectors thereon, wherein a high-reflective sector 232 and a low-reflective sector 234 are disposed alternately along the circumferential direction and each of the sectors 232 and 234 carries a slit 231 in correspondence to the optical path of the infrared radiation emitted from the bottom end of the rod 210. The high-reflective sector 232 may carry a reflective coating such as Al or Au, while the low-reflective sector 234 is provided with a black coating.

In the chopper 230, it should be noted that the slit 231 in the high-reflective sector 232 functions as a measuring part 232a, while the remaining part of the high-reflective sector 232 functions as an interrupting part 232b. Similarly, the slit 232 in the low-reflective sector 234 functions as a measuring part 234a, while the remaining part of the low-reflective sector 234 functions as an interrupting part 234b.

It should be noted that the construction of the chopper 230 of FIG. 13 is only an example, and various modifications can be made from the construction of FIG. 13. For example, the chopper 230 may include semi-circular high-reflective part and low-reflective part bisecting the surface of the circular chopper 230, or the surface of the chopper 230 may be divided into more than the foregoing four quadrants. Further, it is possible to provide the slit 231 only in the high-reflective sector of the chopper 230. Further, the low-reflecting sector 234 may be replaced by a cutout.

When the chopper 230 is rotated with the rotation of the motor 240, there appear the high-reflective sector 232 and the low-reflective sector 234 alternately at the bottom end of the rod 210. Thus, at the instance when the sector 232 is located underneath the rod 210, the majority of the infrared radiation emitted at the bottom end of the rod 210 is reflected back to the rear surface of the wafer W through the rod 210. When the sector 234 is located underneath the rod 210, on the other hand, the majority of the infrared radiation emitted at the bottom end of the rod 210 is absorbed by the low-reflective sector 234. Thus, the photodetector 270 detects the infrared radiation emitted from the rear surface of the wafer W directly and further the radiation after a multiple reflection between the wafer and the high-reflective sector.

The detector 270 includes a lens, a Si photocell, an amplifier, and the like, not illustrated, and converts the infrared radiation incident to the lens to an electrical signal indicative of a radiation intensity $E_1(T)$ or $E_2(T)$ to be described later, wherein the electrical signal thus produced is supplied to the system controller 300. The system controller 300, on the other hand, includes a CPU and a memory and calculates the emissivity $\epsilon$ of the wafer W and the wafer temperature T according to a procedure to be described. This calculation of the temperature can of course be carried out by other arithmetic units in the radiation pyrometer 200 not visible.

In more detail, the infrared radiation passed through the slit 231 is focused by the lens 250 and is guided to the detector 270 via an optical fiber 260. Thereby, the emission strength (or luminance) at the high-reflective sector 232 is represented as follows:

$$E_1(T) = \frac{\epsilon}{1 - R(1-\epsilon)} \times E_{BB}(T),$$

wherein $E_1(T)$ represents the radiation strength obtained by the detector 270 for the high-reflective surface 232 at the temperature T, while R represents the effective reflectance of the high-reflective surface 232. Further E represents the reflectance of the wafer W and $E_{BB}(T)$ represents the radiation strength of a black body at the temperature T.

It should be noted that the foregoing Eq. (2) is derived from the following Eq. (3) assuming that there is no transmittance of the thermal radiation through the wafer W as follows:

$$E_1(T) = \qquad (3)$$
$$\epsilon E_{BB}(T) + \epsilon R(1-\epsilon)E_{BB}(T) + \epsilon[R(1-\epsilon)]^2 E_{BB}(T) + \ldots \infty =$$
$$\frac{\epsilon}{1 - R(1-\epsilon)} E_{BB}(T).$$

Further, it should be noted that the emission strength (or luminance) at the low-reflective sector 234 is represented as follows:

$$E_2(T) = E E_{BB}(T)$$

wherein $E_2(T)$ represents the emission strength of the low-reflection surface 234 at the temperature T obtained by the detector 270. The Eq. (4) is derived from the radiation equation of Planck.

From Eqs. (2) and (4), the emissivity $\epsilon$ is represented as follows:

$$\epsilon = \frac{E_2(T)/E_1(T) + R - 1}{R}. \qquad (5)$$

Generally, the spectrum of the electromagnetic radiation emitted by a black body is given by the Planck's equation, and there holds a relationship between the temperature T of a black body and the emission strength $E_{BB}(T)$ measured by the radiation pyrometer 200 as follows:

$$E_{BB}(T) = C \exp\left(-\frac{C_2}{AT + B}\right),$$

wherein A, B and C are constants determined by the optical system of the radiation pyrometer 200 while C2 represents the second constant of radiation.

The Eq. (6) can be solved with regard to the temperature T and the equation $$T = \frac{C_2}{A[\ln C - \ln E_{BB}(T)]} - \frac{B}{A} \qquad (7)$$

is obtained.

Thus, the emission strength $E_{BB}(T)$ is obtained by the detector 270 and the system controller 300 based on Eq. (5) and Eq. (2) or (4), and the emission strength $E_{BB}(T)$ is used in Eq. (7) to obtain the temperature T of the wafer W.

Figure 14:
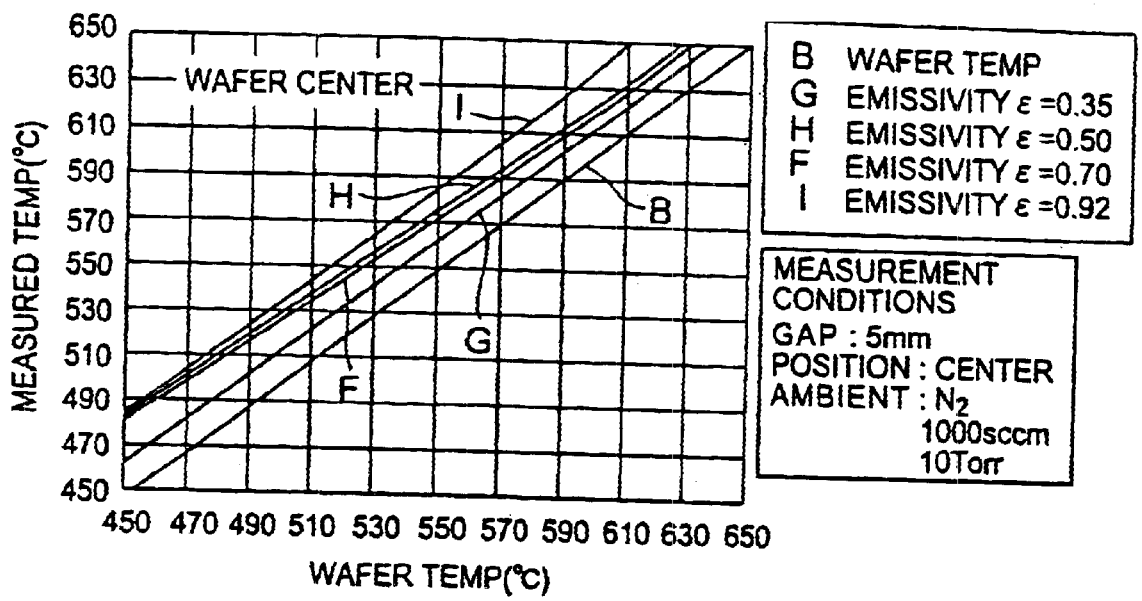
FIG. 14 is a graph showing the relationship between actual wafer temperature and the wafer temperature obtained by the radiation pyrometer while using a conventional conversion equation with regard to a central part of the wafer.
Figure 15:
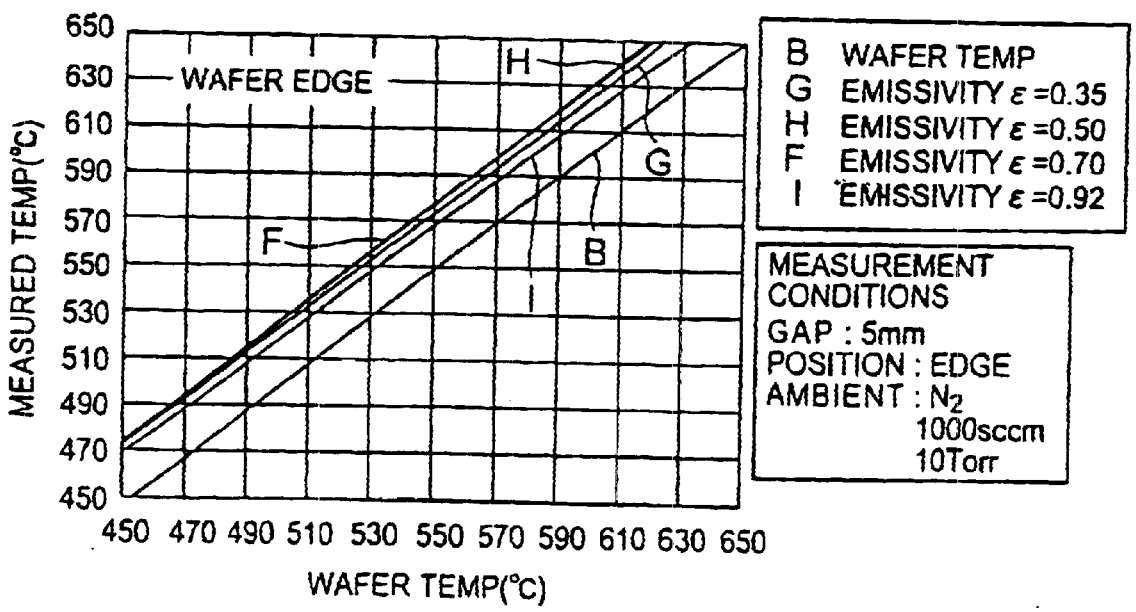
FIG. 15 is a graph showing the relationship between the actual wafer temperature and the wafer temperature obtained by the radiation pyrometer while using a conventional conversion equation with regard to a peripheral edge part of the wafer.

The temperature T thus obtained based on Eq. (7), however, generally contains an error of about 20–40° C. as represented in FIG. 14 or FIG. 15, and it has been difficult to carry out a high-quality thermal processing with accurately controlled temperature when the conventional radiation pyrometer 200 is used, wherein FIG. 14 shows the relationship between the actual temperature of the wafer W at the central part thereof and the temperature obtained by using the radiation pyrometer 200 together with Eq. (1). Further, FIG. 15 shows the relationship between the actual temperature of the wafer W obtained for the marginal part of the wafer W and the corresponding temperature obtained by the radiation pyrometer 200 while using Eq. (1).

Figure 16:
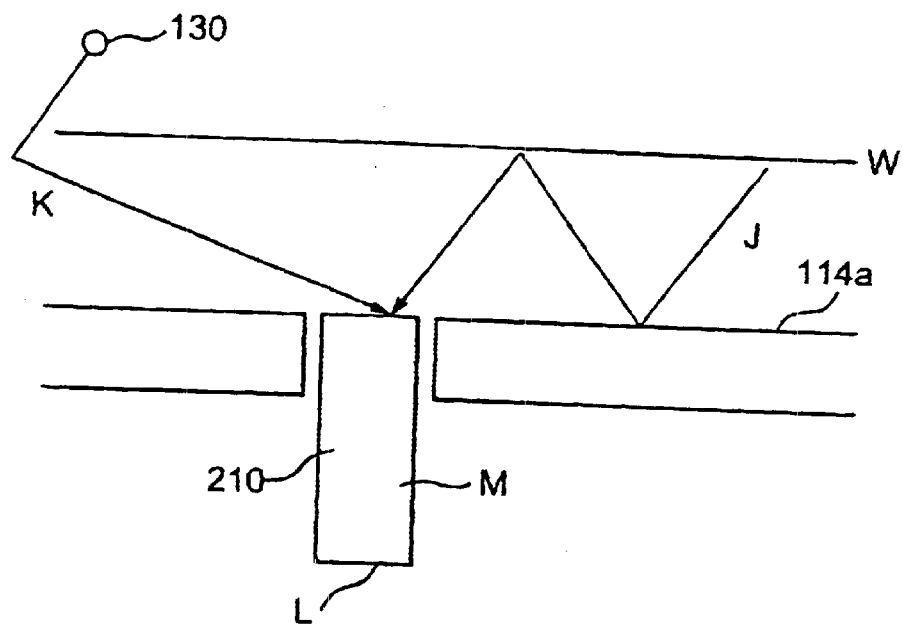
FIG. 16 is a diagram explaining the cause of the error that occurs when the conventional conversion equation is used with the radiation pyrometer of FIG. 12.

After diligent investigation in search of the cause of the error, the inventor of the present invention has finally identified several factors that have caused the foregoing error, as represented in FIG. 16.

More specifically, the rod 210 may be injected with the infrared radiation reflected a number of times between the wafer W and the inner surface 144a of the processing chamber as represented by a ray J in FIG. 16. Further, the rod 210 may be injected with the radiation produced by the lamp 130 and has traveled in the processing chamber 110 as a stray light, as represented in FIG. 16 by a ray K.

Further, the rod 210 itself causes an optical absorption, while such an optical absorption appears as an optical loss M as represented in FIG. 16. Further, reflection at the end surface of the rod 210 may cause another optical loss L as represented in FIG. 16.

In a single-wafer processing apparatus such as the RTP apparatus 100, the interior of the processing chamber 110 and other parts provided in the vicinity of the wafer W are provided with a reflective coating for improving the thermal efficiency. Thus, the problem of the multiple reflection J and the stray light K are particularly important in the RTP apparatus 100 of the present invention. As noted above, FIG. 16 is an enlarged cross-sectional diagram of the processing chamber 110 showing the foregoing various cause of the error when determining the temperature by the radiation pyrometer 200.

From the foregoing, the inventor of the present invention has reached a conclusion that the foregoing error would be compensated for by modifying Eq. (1) to an equation represented as follows, $$E_m(T) = G\left\{\frac{\epsilon}{1 - \alpha(1 - \epsilon)} - \beta\right\}\{E_{BB}(T) + S\} \quad (8)$$

wherein Eq. (8) compensates for the effect of the multiple reflection J by modifying the emissivity $\epsilon$ to formulate an effective emissivity represented as $\epsilon/\{1-\alpha(1-\epsilon)\}$ where $\alpha$ is a correction coefficient.

Further, Eq. (8) compensates for the effect of the stray radiation S by adding a correction term S to $E_{BB}(T)$, wherein the correction term S can be interpreted as representing an additional radiation source that produces the stray radiation. Further, Eq. (8) compensates for the effect of the reflection L at the end of the rod 210 by subtracting a correction term $\beta$ corresponding to the reflection loss L from the effective emissivity $\epsilon/\{1-\alpha(1-\epsilon)\}$. Further, Eq. (8) compensates for the effect of the absorption loss M by multiplying a correction coefficient G (gain coefficient) to the term $[\epsilon/\{1-\alpha(1-\epsilon)\}-\beta]$ $\{E_{BB}(T)+S\}$.

According to situation, one or more of the correction terms may be omitted in Eq. (8). Eq. (8) may be stored in a computer-readable medium such as a magnetic disk or optical disk, together with a computer program for carrying out the temperature measurement. Further, the computer program including Eq. (8) may be transmitted over a telecommunication network from one site to another side in the form of transactions.

Figure 17:
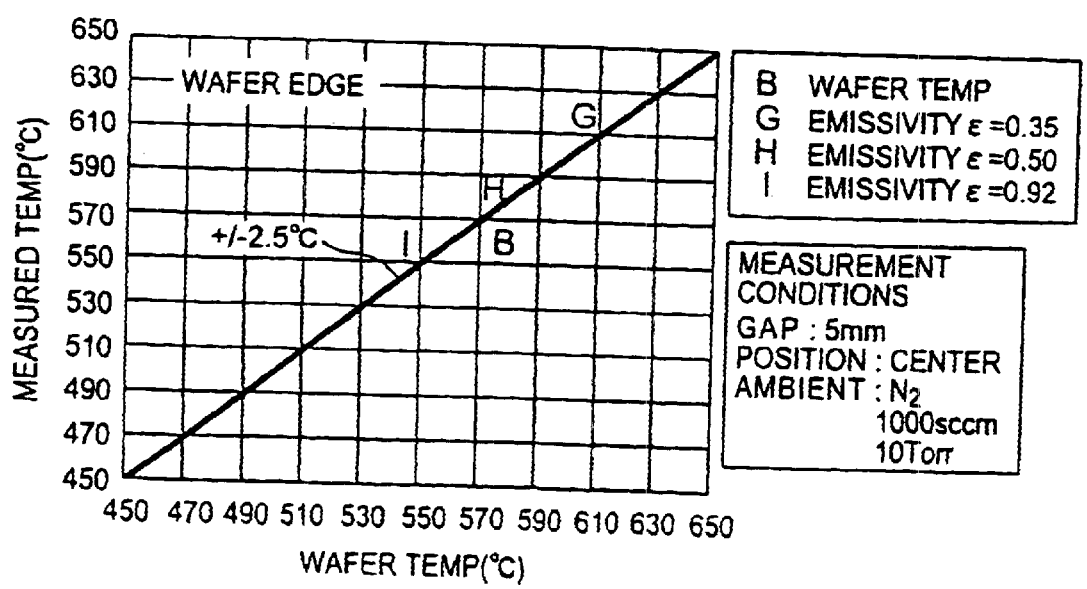
FIG. 17 is a graph showing the relationship between the actual wafer temperature and the wafer temperature obtained by the radiation pyrometer while using a conversion equation according to the present invention with regard to the central part of the wafer.
Figure 18:
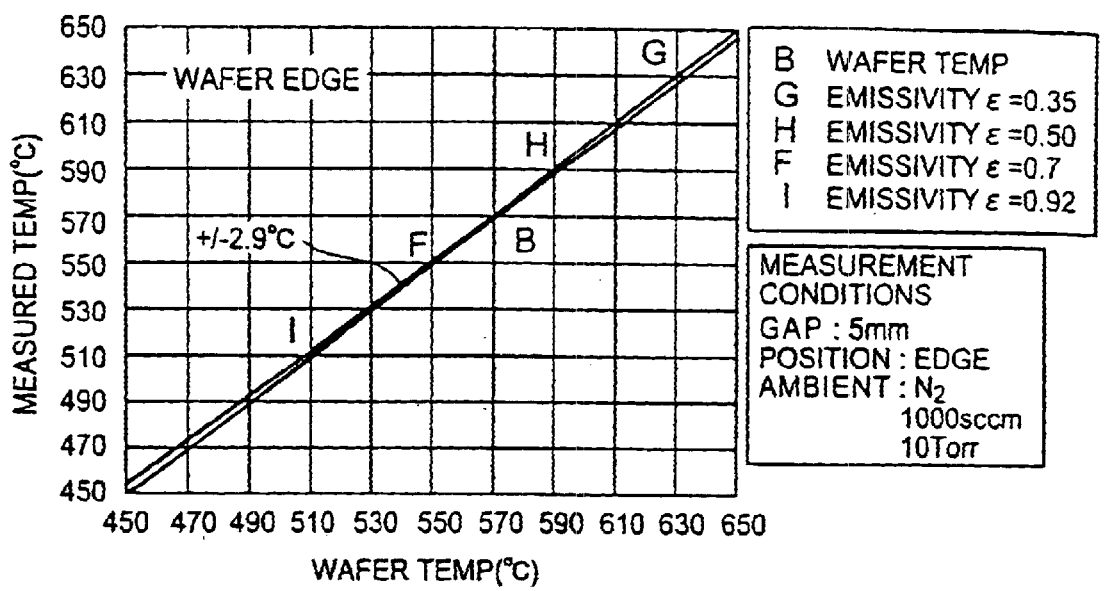
FIG. 18 is a graph showing the relationship between the actual wafer temperature and the wafer temperature obtained by the radiation pyrometer while using a conversion equation according to the present invention with regard to the peripheral edge part of the wafer.

FIGS. 17 and 18 show the pyrometer temperature obtained by Eq. (8) and the actually measured temperature of the wafer, wherein FIG. 17 compares the two temperature readings at the center of the wafer W while FIG. 18 compares the two temperature readings at the edge of the wafer W. As can be seen in FIG. 17 or FIG. 18, the deviation between the two temperature readings is maintained within ±3° C.

It should be noted that the system controller 300 includes therein a CPU and a memory and recognizes the temperature T of the wafer W in the RTP apparatus 100. The system controller 300 then conducts a feedback control of the lamp drive 310 in response to the temperature T. As will be explained later, the system controller 300 further controls the rotation of the wafer W by supplying a driving signal to the motor driver 320 with a predetermined interval.

It should be noted that the gas inlet 180 includes various associated units not illustrated, such as a gas source, flow control valves, mass flow controllers, a gas supply nozzle, and various conduits interconnecting these units. While the illustrated example use the construction of providing the gas inlet 180 on the sidewall 112 of the processing chamber 110, the present invention is not limited to such a specific embodiment and the processing gas may be introduced from a shower head provided at the upper part of the processing chamber 110.

When the thermal processing conducted in the chamber 110 is an anneal processing, a gas such as N2 or Ar is introduced from the gas inlet into the processing chamber 110. When an oxidizing process is to be conducted, on the other hand, any of the gases such as $O_2$ and $H_2$, $H_2O$ or $NO_2$ may be used. Further, when the processing is a deposition process, gases such as $NH_3$, $SiH_2Cl_2$, $SiH_4$, and the like, are used. It should be noted that the gases used in the RTP apparatus of the present invention is not limited to such a specific gas.

It should be noted that the mass flow controller is used for controlling the flow-rate of the gas and may be the type that includes a bridge circuit, an amplifying circuit, a comparator control circuit and a flow-control valve. The mass flow controller of this type controls the flow-control valve by detecting the gas flow-rate based on the measurement of the thermal transfer caused by the gas flow flowing from an upstream side to a down stream side.

The gas supply system is designed to prevent penetration of impurities from the gas conduit into the gas by using a seamless pipe. Further, a bite type joint or a metal gasket joint is used for the same purpose. Further, in order to eliminate dust particles due to the contamination or corrosion inside the conduit, it is practiced to cover the inner surface of the conduit by an insulating material such as PTFE, PFA, polyimide, PBI, and the like Alternatively, the inner surface of the conduit may be subjected to an electrolytic polishing process. Further, there are cases in which a dust particle trap is provided.

In the construction of FIG. 1, it should be noted that the exhaust port 190 is provided so as to evacuate the processing chamber 110 in a generally horizontal direction similarly to the gas inlet port 180. It should be noted that the exhaust port 190 is not limited to such a construction but the exhaust port 190 may be provided at other locations, with two or more numbers. The exhaust port 190 is connected to a suitable evacuation pump such as a turbo molecular pump, a sputter-ion pump, a getter pump, a sorption pump, a cryopump, and the like, via a pressure regulation valve.

While the processing chamber 110 is maintained under a reduced pressure environment during the process in the present embodiment, the present invention is applicable also to the case in which the processing does not require a reduced pressure environment. For example, the RTP apparatus 100 may be applicable to the processing conducted in the pressure range from 133 Pa to the atmospheric pressure. Further, it should be noted that the exhaust port 190 has further the function of removing the He gas used in the process to be explained with reference to FIGS. 20–24 from the processing chamber 110, before the next process is started.

Figure 19:
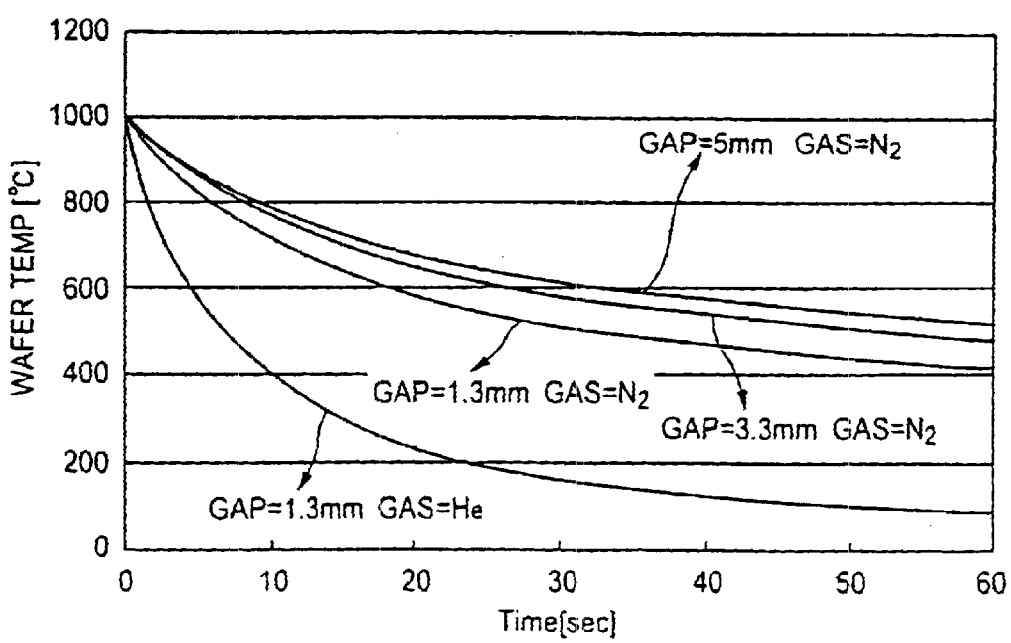
FIG. 19 is a diagram showing the result of a simulation with regard to the cooling rate of the wafer in the RTP apparatus of FIG. 1.

FIG. 19 is a graph representing the result of a simulation conducted with regard to the cooling rate of the wafer W for the RTP apparatus 100 of FIG. 1, wherein the "gap" represented in FIG. 19 indicates the interval between the wafer W and the bottom part 114 of the processing chamber 110.

Referring to FIG. 19, it can be seen that the cooling rate increases with decreasing size of the gap and that the cooling rate is increased remarkably when a He gas is supplied to the processing chamber 110 such that the He gas flows between the substrate W and the bottom part 114.

It should be noted that the construction of the RTP apparatus 100 of FIG. 1 uses the bottom part 114 acting as a cooling plate at the rear side of the wafer W while heating the wafer W from the top side by the lamp 130. Thus, the construction of FIG. 1 provides a relatively large cooling rate, while it requires a large electric power for rapid temperature increase due to large heat dissipation. In order to save the electric power at the time of the temperature rise, it is possible to interrupt the supply of the cooling water, while such a process is generally not acceptable due to the problem of decrease of yield of the wafer processing.

Figure 20:
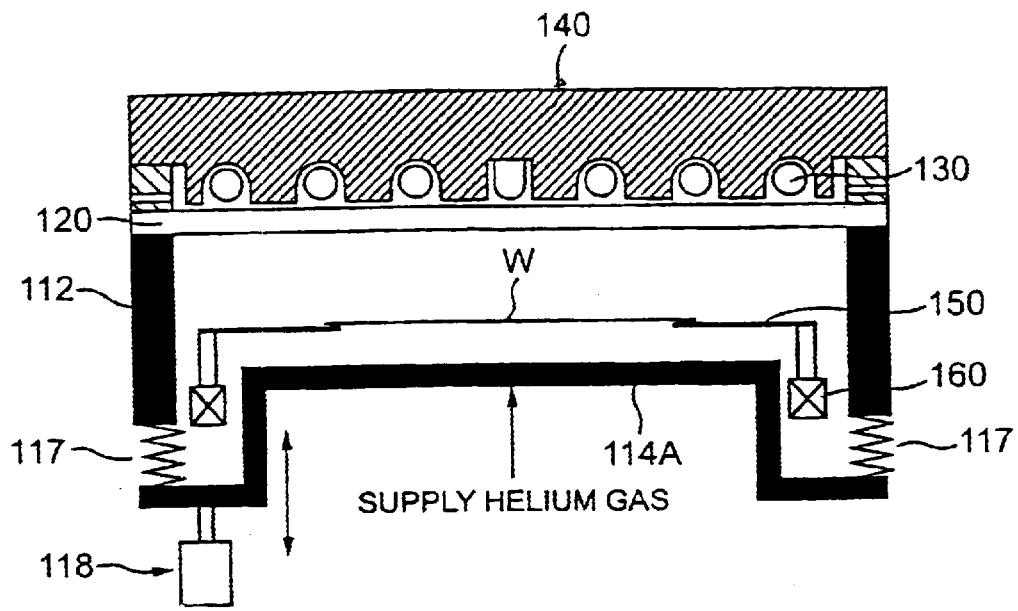
FIG. 20 is a diagram showing a modification of the RTP apparatus of FIG. 1.
Figure 21:
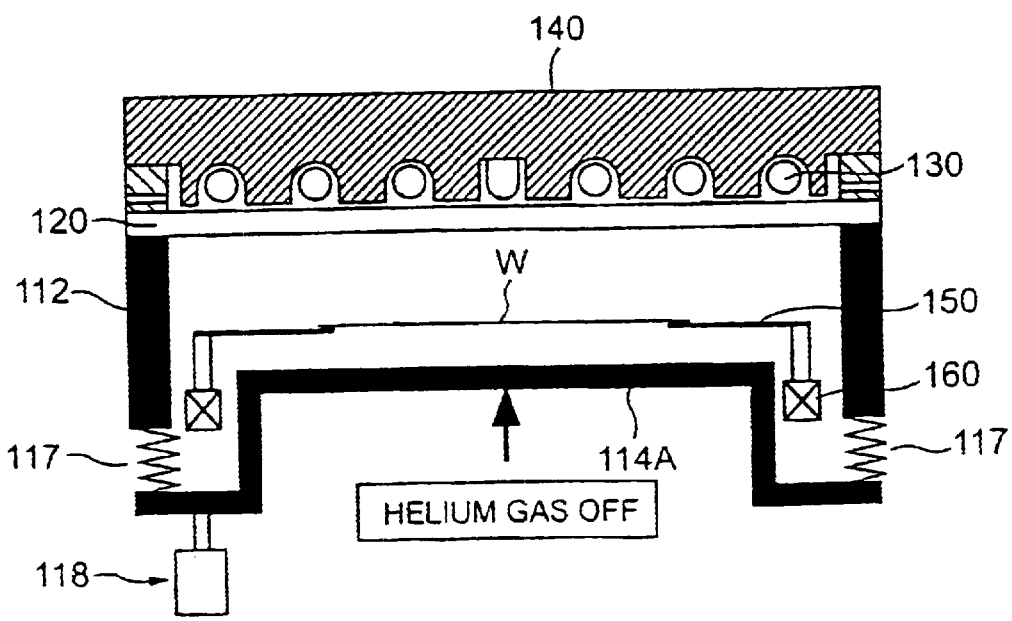
FIG. 21 is a diagram showing the state of the RTP apparatus of FIG. 20 when carrying out a rapid heating of the wafer to be processed.
Figure 22:
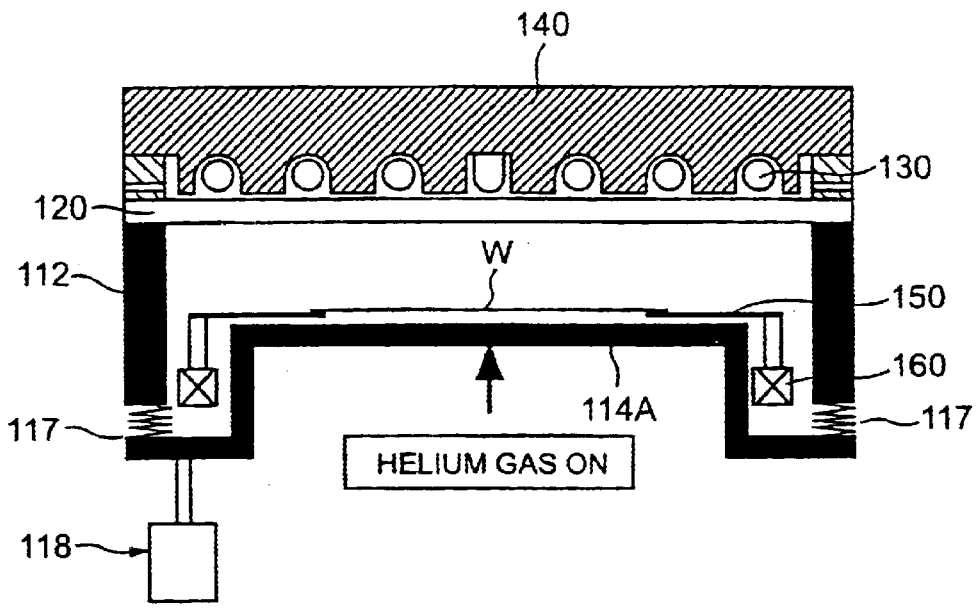
FIG. 22 is a diagram showing the state of the RTP apparatus of FIG. 20 when carrying out a rapid cooling of the water to be processed.

Thus, in order to avoid this problem, it is possible to use a bottom part 114A represented in FIGS. 20–22 in place of the bottom part 114, wherein the bottom part 140A is provided movable with respect to the wafer W. Further, a thermal conductive He gas is caused to flow between the wafer W and the bottom part 114A for enhancing the heat dissipation of the wafer W. It should be noted that FIG. 20 is a schematic cross-sectional view showing the movable construction of the bottom part 114A with respect to the wafer W, while FIG. 21 shows the positional relationship used in the RTP apparatus 100 between the bottom part 114A and the wafer W when carrying out a rapid heating of the wafer W. Further, FIG. 22 shows the positional relationship used in the thermal processing apparatus 100 between the bottom part 114A and the wafer when carrying out a rapid cooling of the wafer W. In the illustration of FIGS. 20–22, the illustration of the radiation pyrometer 200 and the cooling passages 116a and 116b is omitted for the sake of simplicity.

As represented in FIG. 20, the illustrated construction uses a bellows for maintaining the reduced pressure environment inside the processing chamber 110, wherein the bottom part 114A is moved up and down with respect to the wafer W by an elevating mechanism 117 under control of the system controller 300. As any available mechanism can be used for the elevating mechanism 117, further explanation thereof will be omitted. Contrary to the present embodiment, it is also possible to construct the support ring 150 as a movable part, so that the wafer W is moved up and down in the processing chamber 110.

Thus, when heating the wafer W, the bottom part 114A is lowered as represented in FIG. 21 so as to increase the distance between the wafer W and the bottom part 114A and the supply of the He gas is interrupted. In an example, a distance of about 10 mm is secured between the wafer W and the bottom part 114A. Because of the large distance between the bottom part 114A and the wafer W, the thermal influence of the bottom part 114A on the wafer W is reduced and the temperature of the wafer W is increased rapidly. For example, the state of FIG. 21 may be defined as a home position of the wafer W.

When cooling the wafer W, on the other hand, the bottom part 114A is lifted up toward the wafer W so as to reduce the distance therebetween, and the supply of the He gas is started. Because of the small distance between the wafer W and the bottom part 114A, the wafer W is cooled rapidly as a result of the increased thermal influence of the bottom part 114A. Typically, a distance of about 1 mm is used between the wafer W and the bottom part 114A.

Figure 23:
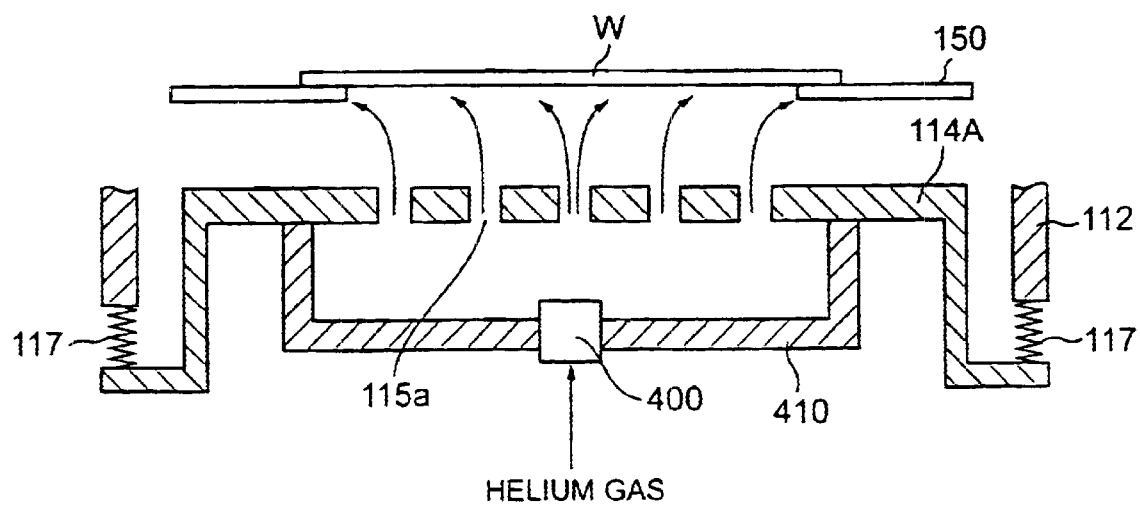
FIG. 23 is a diagram showing the supply of a thermal conducting gas to the bottom surface of the substrate in the thermal processing apparatus of FIG. 20.

FIG. 23 shows the introduction of the He gas, wherein FIG. 23 represents the encircled region V of FIG. 22 in an enlarged scale.

Referring to FIG. 23, the bottom part 114 is provided with a number of minute holes 115a, and the He gas is introduced into the space between the rear surface of the wafer W and the bottom part 114 via these minute holes 115a. It should be noted that a case 410 having a valve 400 is attached to the bottom part 114 and a gas supply line from a He gas source is connected to the valve 400.

It should be noted that the construction of FIGS. 20–22 designed for changing the distance between the wafer W and the bottom part 114 of the processing chamber 110 can be used also for changing the distance between the wafer W and the lamp 130.

Hereinafter, the construction for rotating the wafer W will be explained with reference to FIG. 1.

In order to maintain a high yield in the production of semiconductor devices and integrated circuits and for maintaining a high performance of the individual semiconductor devices, it is required that the wafer W experiences a uniform RTP over the entire surface thereof. When there is a non-uniform temperature distribution on the wafer W, various problems such as non-uniform film thickness or formation of slip dislocation in the silicon crystal caused by a thermal stress, are expected, and the RTP apparatus 100 can no longer provide the high-quality thermal processing.

Such a non-uniform temperature distribution on the wafer W may be caused by the non-uniform distribution of the radiation of the lamp 130 or may be caused by the thermal effect of the low-temperature processing gas injected into the processing chamber 110 from the gas inlet 180. In order to eliminate such a non-uniformity of temperature distribution and to guarantee a uniform heating of the wafer W, the RTP apparatus 100 may include a rotating mechanism for rotating the wafer W.

It should be noted that the rotating mechanism of the W includes, in addition to the support ring 150 and the ring-shaped permanent magnet 170, a magnetic body 172 attached to the bottom edge of the rotary support member 152. The magnetic body 172 is provided in a concentric relationship with respect to the permanent magnet 170, and the permanent magnet 170 is rotated by a motor 330 driven by a driver circuit 320 under control of the system controller 300. Thus, in response to the rotation of the permanent magnet 170, the magnetic body 172, and hence the support ring 150 connected to the magnetic body 172 via the rotary support member 152, is rotated.

Typically, the support ring 150 is formed of a refractory ceramic material such as SiC and is formed to have a ring-shape. As noted previously, the support ring 150 functions as a stage of the wafer W and has a central cutout exposing the rear surface of the wafer W. As the central cutout has a diameter smaller than the outer diameter of the wafer W, the support ring 150 can support the wafer W thereon by engaging with a peripheral edge part of the wafer W. If necessary, the support ring 150 may carry a clamp mechanism or an electrostatic chuck for holding the wafer W firmly. By using the support ring 150, it becomes possible to prevent the deterioration of temperature profile caused by thermal radiation at the peripheral edge part of the wafer W.

As noted previously, the support ring 150 carries the rotary support member 152 connected to a peripheral edge part thereof, wherein the rotary support member 152 is connected to the peripheral edge part of the support ring 150 via a thermal insulating member such as a quartz glass such that the magnetic body 172 is thermally protected. In the illustrated example, the rotary support member 152 is formed of a cylindrical sleeve of a devitrified quartz glass.

Between the rotary support member 152 and the sidewall 112 of the processing chamber 110, there is provided a bearing mechanism 160 for allowing free rotation of the rotary support member 152 in the state that the processing chamber 110 is evacuated to a high vacuum state, wherein the bearing mechanism 160 is fixed upon the inner surface of the sidewall 112. As noted already, the magnetic body 172 is provided at the bottom edge of the rotary support member 152.

As noted previously, the ring-shaped permanent magnet 170 and the magnetic body 172 are provided in a concentric relationship, wherein the permanent magnet 170 and the magnetic body 172 achieves a magnetic coupling via the sidewall 112 of the processing chamber 112, which is typically formed of a non-magnetic material such as Al. Thus, the magnetic body 172 undergoes rotation in response to a rotation of the magnet 170, which is driven by the motor driver circuit 320 via the motor 330 under control of the system controller 300. Thereby, the rotational speed is determined in view of the material and size of the wafer W and further in view of the gas atmosphere and temperature in the processing chamber 110 so as to avoid turbulence of the atmosphere in the processing chamber 110, particularly in the peripheral part of the wafer W. In the illustrated example, the support ring 150 is rotated at a rotational speed of 90 RPM. It should be noted that it is possible to use a magnetic material for the magnet 170 and a permanent magnet for the magnetic material 172, as long as they are magnetically coupled. Further, both of the members 170 and 172 may be formed of a permanent magnet.

Next, the operation of the RTP apparatus 100 will be explained.

First, the wafer W is incorporated into the processing chamber 110 by a transportation means such as a transportation arm of a cluster tool not illustrated via a gate valve of the processing chamber 110 not illustrated. When the arm carrying the wafer W has reached the top part of the support ring 150, a number of lifter pins (typically three) are moved upward from the support ring 150 and engages with the rear surface of the wafer W. In this state, the arm is retracted through the gate valve, and the gate valve is closed. The transportation arm may thereafter return to its home position not illustrated.

Next, the lifter pins are retracted into the support ring 150 and the wafer W is held on a predetermined position of the support ring 150. The driving of the lifter pins may be achieved by using a bellows not illustrated so as to maintain the evacuated, low-pressure environment in the processing chamber 110 and so as to avoid leakage of the atmosphere in the processing chamber 110 into the atmospheric environment.

Thereafter, the system controller 300 controls the lamp driver 310 so as to energize the high-power lamp 130. In response thereto, the lamp driver 310 energizes the lamp 130 and the wafer W is heated to a temperature of about 800° C.

More specifically, the infrared radiation emitted by the lamp 130 illuminates the top surface of the wafer W and the temperature of the wafer W is increased rapidly to the foregoing temperature of 800° C. with a rate of 200° C./s. While there is a general tendency that the marginal part of the wafer W has a large heat dissipation rate as compared with the central part thereof, the present invention can successfully compensate for the appearance of non-uniform temperature profile by providing the lamp 130 in the form of a number of concentric lamp elements and by energizing the lamp elements independently.

During this phase of rapid temperature rise, the bottom part 114A is set to the home position represented in FIG. 21, provide that the construction of FIG. 20 is used. It should be noted that the state of FIG. 21 is particularly advantageous for rapid temperature rise due to the increased distance of the bottom part 114A acting as a cooling plate from the wafer W. Simultaneously to the heating, the evacuation system connected to exhaust port 190 is driven so as to maintain the reduced pressure environment in the processing chamber 110.

During the foregoing phase of rapid temperature rise, the system controller 300 controls the motor drive 320 so as to drive the motor 330 at a predetermined, optimum speed. In response, the motor 330 is energized and the ring-shaped magnet 170 is rotated with the foregoing optimum speed. As a result of the rotation of the magnet 170, the support member 152 is rotated together with the support ring 150 and the wafer W placed thereon. As a result of the rotation of the wafer W, the temperature in the wafer W is maintained uniform during the interval of the rapid thermal processing.

Because the relatively small thickness of the quartz plate 121 constituting the quartz window 120, various advantages such as: (1) decreased absorption of the radiation emitted by the lamp 130; (2) reduced thermal stress induced in the quartz plate 121 because of reduced temperature difference between the top surface and the bottom surface; (3) reduced deposition of films or byproducts on the surface of the quartz plate during a deposition process due to reduced temperature of the quartz plate 121; (4) sufficient mechanical strength reinforced by the ribs 122 for sustaining the air pressure difference between the atmospheric pressure and the low-pressure inside the processing chamber 110, even in the case the thickness of the quartz plate 121 is thus reduced; (5) reduced temperature rise of the ribs 122, provided that the construction of FIG. 6 in which the ribs 122 are inserted into the corresponding grooves 146 of the reflector 140A is used, and resultant decrease of thermal stress at the junction part where the quartz plate 121 and the ribs 122 are connected; and (6) further improved resistance of the quartz window with regard to the pressure difference between the atmospheric environment and the interior of the processing chamber 110, provides the the construction of FIG. 6 is used.

The temperature of the wafer W is measured by the radiation pyrometer 200 and the system controller 300 carries out a feedback control of the lamp driver 310 based on the temperature reading of the radiation pyrometer 200. While it is generally expected that a uniform temperature distribution is realized in the wafer W due to the rotation of the wafer W, it is also possible to provide the radiation pyrometer 200 at a plurality of locations such as the center and peripheral edge of the wafer W, if necessary. In such a case, it becomes possible to modify the energization of the lamp 130 locally via the lamp drive 310 when it is judged that the temperature distribution in the wafer W is not uniform.

In the present invention, it should be noted that the distance between the wafer W in the processing chamber 110 and the chopper 230 in the radiation pyrometer 200 is increased as a result of the use of the rod 210, and the adversary thermal influence of the wafer W on the radiation pyrometer 200 is minimized. Thus, the construction of the present invention improves the accuracy of the radiation pyrometer 200. Further, because of the increased distance between the wafer w and the chopper 230, it is not necessary at all to provide a cooling mechanism to the radiation pyrometer 200 or it is sufficient to provide only a simple cooling system. Thereby the cost and size of the RTP apparatus 100 are reduced.

In view of the possibility of extensive diffusion of impurity elements taking place in the wafer W when the wafer W is plated in a high temperature environment over a prolonged duration and resultant deterioration of the performance of the semiconductor devices and integrated circuits formed therein, the use of the radiation pyrometer 200 is particularly useful for realizing an RTP apparatus in which a rapid temperature rise and rapid temperature drop are achieved under feedback control. Particularly, the error of temperature reading of the radiation pyrometer 200 is suppressed within +3° C. by using Eq. (8) in the pyrometer 200 or in the system controller 300 for the temperature calculation. Thereby, a high-quality temperature control is realized.

After the foregoing phase of rapid temperature rise, a processing gas is introduced into the processing chamber 110 from a gas inlet with controlled flow-rate.

After a predetermined interval such as 10 seconds for the thermal processing, the system controller 300 controls the driver 310 and terminates the energization of the lamp 130. In response thereto, the lamp driver 310 interrupts the supply of the driving power to the lamp 130.

In this rapid cooling phase, the system controller 300 controls the elevating mechanism 117 in the case the RTP apparatus 100 has the construction of FIG. 20, such that the bottom part 114A is lifted up to the cooling position as represented in FIG. 23. Further, a thermally conductive gas such as He is introduced into the gap between the wafer W and the bottom part 114A as represented in FIG. 23 for facilitating the cooling of the wafer W. With this, it becomes possible to achieve a cooling rate of as large as 200° C./sec.

After the foregoing thermal processing, the wafer W is taken out from the processing chamber 110 through the gate valve by the transportation art in a reverse procedure noted before. If necessary, the transportation arm further transfers the wafer W thus processed to a next stage processing apparatus, which may be a deposition apparatus.

Further, the present invention is not limited to the embodiments described heretofore but various variations and modifications may be made without departing from the scope of the invention.

What is claimed is:

1. A method of detecting a temperature of an object in a multiple-reflection environment by way of a radiation pyrometer, comprising the steps of:

detecting a radiation strength emitted from a target region of said object;

applying a correction term to said radiation strength so as to compensate for the effect of multiple reflections of a radiation emitted from said object;

applying a correction term to said radiation strength so as to compensate for a reflection loss caused at an end surface of an optical medium interposed between said object and said sensing head;

applying a correction term to said radiation strength so as to compensate for an optical absorption loss caused in said optical medium;

and applying a correction term to said radiation strength so as to compensate for a stray radiation coming in to said sensing head from a source other than said target region of said object.

2. A method as claimed in claim 1, wherein said temperature of said object is calculated from said radiation strength $E_m(T)$ of said object detected by said radiation pyrometer from an emission strength $E_{BB}$ (T) of a black body at a temperature T while using an emissivity E of said object according to an equation, $$E_m(T) = G\left\{\frac{\epsilon}{1 - \alpha(1 - \epsilon)} - \beta\right\}\{E_{BB}(T) + S\}$$

wherein $\alpha$ represents a correction coefficient with regard to said multiple reflection, $\beta$ represents a correction term with regard to said reflection loss, G represents a correction coefficient with regard to said optical absorption, and S represents a correction term with regard to said stray radiation, said parameters $\alpha$, $\beta$, G and S taking respective values excluding a case of $\alpha=\beta=S=0$ and simultaneously G=1.

3. A thermal processing apparatus, comprising:

a processing chamber for applying a predetermined thermal processing to a substrate incorporated into said processing chamber;

a heat source provided adjacent to said processing chamber for heating said substrate;

a radiation pyrometer coupled to said processing chamber for measuring a temperature of said substrate; and a control unit controlling energization of said heat source in response to a temperature of said substrate obtained by said radiation pyrometer, said radiation pyrometer comprising: a rotary chopper disposed outside said processing chamber in an optical path of an infrared radiation emitted from said substrate, said chopper having a slit and a high-reflection surface and a low-reflection part; a transparent rod disposed between said substrate and said chopper as an optical window of said processing chamber, said transparent rod extending toward said chopper and allowing a multiple reflection of said infrared radiation between said chopper and said substrate; and a detector disposed behind said chopper for detecting said infrared radiation passed through said slit, said a temperature of said substrate being calculated from a radiation strength $E_m(T)$ of said substrate measured by said radiation pyrometer from an emission strength $E_{BB}$ (T) of a black body at a temperature T while using an emissivity f of said substrate according to an equation, $$E_m(T) = G\left\{\frac{\epsilon}{1 - \alpha(1 - \epsilon)} - \beta\right\}\{E_{BB}(T) + S\}$$

wherein $\alpha$ represents a correction coefficient with regard to a multiple reflection of said infrared radiation between said substrate and an inner surface of said processing chamber, $\beta$ represents a correction term with regard to a reflection loss at an end surface of said transparent rod, G represents a correction coefficient with regard to an optical absorption caused by said transparent rod, and S represents a correction term with regard to a stray radiation coming in to said transparent rod said parameters $\alpha$, $\beta$, G and S taking respective values excluding a case of $\alpha=\beta=S=0$ and simultaneously G=1.

4. A thermal processing apparatus as claimed in claim 3, wherein said temperature of said substrate is calculated by said control unit.

5. A thermal processing apparatus as claimed in claim 3, wherein said temperature of said substrate is calculated by said radiation pyrometer.

6. A thermal processing method of a substrate, comprising the steps of:

heating a substrate in a processing chamber by energizing a heat source under a reduced pressure environment;

measuring a temperature of said substrate by an emission pyrometer; and controlling energization said heat source in response to said temperature of said substrate measured by said emission pyrometer, said emission pyrometer comprising: a rotary chopper carrying a slit and a high-reflective surface and a low-reflective region; a transparent rod disposed between said substrate and said chopper as an optical window, said transparent rod extending toward said chopper and allowing a multiple reflection of said infrared radiation between said chopper and said substrate; and a detector disposed behind said chopper for detecting said infrared radiation passed through said slit, said step of measuring said temperature of said substrate comprising the steps of:

detecting a radiation strength emitted from a target region of said substrate by said emission pyrometer;

applying a correction term to said radiation strength so as to compensate for the effect of multiple reflections of a radiation emitted from said substrate and reflected between said substrate and an inner surface of said processing chamber;

applying a correction term to said radiation strength so as to compensate for a reflection loss caused at an end surface of said transparent rod;

applying a correction term to said radiation strength so as to compensate for an optical absorption loss caused in said transparent rod; and applying a correction term to said radiation strength so as to compensate for a stray radiation coming in to said detector of said pyrometer from a source other than said target region of said substrate.

7. A thermal processing method as claimed in claim 6, wherein said radiation pyrometer calculates said temperature of said substrate from said radiation strength $E_m(T)$ detected by said radiation pyrometer for said substrate from an emission strength $E_{BB}(T)$ of a black body at a temperature T while using an emissivity E of said substrate according to an equation, $$E_m(T) = G\left\{\frac{\epsilon}{1 - \alpha(1 - \epsilon)} - \beta\right\}\{E_{BB}(T) + S\}$$

wherein $\alpha$ represents a correction coefficient with regard to said multiple reflection of said infrared radiation, $\beta$ represents a correction term with regard to said reflection loss at said end surface of said transparent rod, G represents a correction coefficient with regard to said optical absorption loss caused by said transparent rod, and S represents a correction term with regard to said stray radiation coming in to said transparent rod said parameters $\alpha$, $\beta$, G and S taking respective values excluding a case of $\alpha=\beta=S=O$ and simultaneously G=1.

8. A processor-readable medium storing a process for detecting a temperature of an object in a multiple-reflection environment by way of a radiation pyrometer, comprising the steps of:

detecting a radiation strength emitted from a target region of said object;

applying a correction term to said radiation strength so as to compensate for the effect of multiple reflections of a radiation emitted from said object;

applying a correction term to said radiation strength so as to compensate for a reflection loss caused at an end surface of an optical medium interposed between said object and said sensing head;

applying a correction term to said radiation strength so as to compensate for an optical absorption loss caused in said optical medium; and applying a correction term to said radiation strength so as to compensate for a stray radiation coming in to said sensing head from a source other than said target region of said object.

9. A processor-readable medium as claimed in claim 8, wherein said temperature of said object is calculated from said radiation strength $E_m(T)$ of said object detected by said radiation pyrometer from an emission strength $E_{BB}(T)$ of a black body at a temperature T while using an emissivity E of said object according to an equation, $$E_m(T) = G\left\{\frac{\epsilon}{1 - \alpha(1 - \epsilon)} - \beta\right\}\{E_{BB}(T) + S\}$$

wherein $\alpha$ represents a correction coefficient with regard to said multiple reflection, $\beta$ represents a correction term with regard to said reflection loss, G represents a correction coefficient with regard to said optical absorption, and S represents a correction term with regard to said stray radiation, said parameters $\alpha$, $\beta$, G and S taking respective values excluding a case of $\alpha=\beta=S=O$ and simultaneously G=1.

10. A thermal processing apparatus, comprising:

a processing chamber including therein a stage adapted for supporting a substrate thereon, said processing chamber having an evacuation port for connection to an evacuation system;

a heat source provided so as to heat said substrate in said processing chamber;

a radiation pyrometer coupled to said processing chamber for measurement of a temperature of said substrate;

a control unit for controlling energization of said heat source in response to a temperature of said substrate; and a cooling mechanism for cooling a part of said processing chamber in the vicinity of said radiation pyrometer, said radiation pyrometer comprising:

a rotary chopper having a slit and a high-reflective surface and a low-reflective region, said rotary chopper being disposed in an optical path of a radiation emitted from said substrate;

a transparent rod disposed in said optical path between said substrate and said chopper, said transparent rod allowing a multiple reflection of said radiation between said wafer and said chopper; and a detector disposed behind said chopper for detecting said radiation passed through said slit.

11. A thermal processing apparatus as claimed in claim 10, wherein said transparent rod is formed of any of a quartz rod and a sapphire rod.

12. A thermal processing apparatus as claimed in claim 10, further comprising an optical fiber disposed between said transparent rod and said rotary chopper.

13. A thermal processing apparatus as claimed in claim 10, wherein said transparent rod is provided in a hole formed in said processing chamber together with a sealing member sealing a space between said transparent rod and an inner wall of said hole.

14. A thermal processing method, comprising the steps of:

heating a substrate under a reduced pressure environment by energizing a heat source;

measuring a temperature of said substrate by a radiation pyrometer; and controlling energization of said heat source in response to said temperature measured by said radiation pyrometer, said radiation pyrometer comprising: a rotary chopper having a slit and a high-reflective surface and a low-reflective region; a transparent rod disposed between said chopper and said substrate for allowing multiple reflections of radiation emitted from said substrate; and a detector disposed behind said rotary chopper for detecting said radiation passed through said transparent rod and said slit on said rotary chopper, said method further comprising the step of guiding said radiation to said chopper through said transparent rod.

* * * * *